US012796080B2

(12) United States Patent
Bai et al.

(10) Patent No.: US 12,796,080 B2
(45) Date of Patent: Nov. 10, 2026

(54) MASK PLATE, DISPLAY SUBSTRATE, DISPLAY PANEL AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Jinchao Bai, Beijing (CN); Chen Xu, Beijing (CN); Jing Liu, Beijing (CN); Xiangqian Ding, Beijing (CN); Bo Liu, Beijing (CN); Yanxin Ji, Beijing (CN); Jie Gao, Beijing (CN); Yue Liu, Beijing (CN); Mengnan Wang, Beijing (CN)

(73) Assignees: Beijing BOE Display Technology Co., Ltd., Beijing (CN); Beijing BOE Technology Development Co., Ltd., Beijing (CN)

( * ) Notice: Subject to any disclaimer, the term of this patent is extended or adjusted under 35 U.S.C. 154(b) by 388 days.

(21) Appl. No.: 18/699,589

(22) PCT Filed: Mar. 1, 2023

(86) PCT No.: PCT/CN2023/079094
§ 371 (c)(1),
(2) Date: Apr. 8, 2024

(87) PCT Pub. No.: WO2024/178680
PCT Pub. Date: Sep. 6, 2024

(65) Prior Publication Data

US 2025/0227998 A1 Jul. 10, 2025

(51) Int. Cl.
*H10D 86/01* (2026.01)
*H10D 86/40* (2025.01)
*H10D 86/60* (2025.01)

(52) U.S. Cl.
CPC ....... *H10D 86/0231* (2025.01); *H10D 86/443* (2025.01); *H10D 86/60* (2025.01)

(58) Field of Classification Search
CPC .. H10D 86/0231; H10D 86/443; H10D 86/60; H10P 76/00; G02F 1/1335; G02F 1/38
See application file for complete search history.

(56) References Cited

U.S. PATENT DOCUMENTS

2016/0035747 A1* 2/2016 Zhang .................. G02F 1/1345 438/158
2017/0363966 A1 12/2017 Sasanuma et al.
(Continued)

FOREIGN PATENT DOCUMENTS

CN 104252098 A 12/2014
CN 108873508 A 11/2018
(Continued)

OTHER PUBLICATIONS

International Search Report and Written Opinion from PCT Application Serial No. PCT/CN2023/079094, dated Nov. 7, 2023,12 pages.

*Primary Examiner* — Bac H Au
(74) *Attorney, Agent, or Firm* — Kinney & Lange, P.A.

(57) ABSTRACT

Provided are a mask plate, a display substrate, a display panel and a display device. In the mask plate, an orthographic projection of at least one compensation light-shielding portion on a first base substrate is located between those of two adjacent light shielding portions. An orthographic projection of at least one compensation light-shielding portion in a second direction overlaps at least partially with that of a first width gradient portion of an $i^{th}$ light shielding portion in two adjacent light shielding portions, and an orthographic projection of the compensation light-shielding portion in a first direction overlaps at least partially with an orthographic projection of a first corner portion of a $j^{th}$ light (Continued)

shielding portion in the two adjacent light shielding portions. A corner of the first corner portion of the $i^{th}$ light shielding portion is oriented toward the $j^{th}$ light shielding portion.

20 Claims, 12 Drawing Sheets

(56) References Cited

U.S. PATENT DOCUMENTS

| | | | | |
|---|---|---|---|---|
| 2022/0317848 | A1* | 10/2022 | Li | G06F 3/04164 |
| 2022/0326599 | A1* | 10/2022 | Zou | G03F 1/38 |

FOREIGN PATENT DOCUMENTS

| | | | |
|---|---|---|---|
| CN | 210092083 | U | 2/2020 |
| CN | 216979582 | U | 7/2022 |
| JP | H07120932 | A | 5/1995 |
| JP | 2007142382 | A | 6/2007 |

* cited by examiner

MASK PLATE, DISPLAY SUBSTRATE, DISPLAY PANEL AND DISPLAY DEVICE

CROSS REFERENCE TO RELATED APPLICATION(S)

This application is a Section 371 National Stage Application of International Application No. PCT/CN2023/079094 filed on Mar. 1, 2023, the whole disclosure of which is incorporated herein by reference in its entirety.

TECHNICAL FIELD

The present disclosure relates to the field of display technology, and in particular, to a mask plate, a display substrate, a display panel and a display device.

BACKGROUND

At present, in order to meet the demand for a narrow bezel of a display apparatus, a line width and a line distance size of peripheral wires on a display substrate are becoming smaller. With the decrease in the line distance size of the peripheral wires, it is easy to encounter problems of too thin or even broken wires at specific positions in an actual production process, which has a serious influence on a product yield.

SUMMARY

In view of the above-mentioned problems, the present disclosure provides a mask plate, a display substrate, a display panel and a display device.

According to a first aspect of the present disclosure, a mask plate is provided, including: a first base substrate; a light shielding layer provided on the first base substrate; and a plurality of light shielding portions and at least one compensation light-shielding portion provided in the light shielding layer, at least one of the light shielding portions is configured to form at least one signal line lead in a fan-out region of the display substrate, and the at least one compensation light-shielding portion is spaced apart from the plurality of light shielding portions, the at least one light shielding portion includes a first light shielding sub-portion, a first width gradient portion, a second light shielding sub-portion and a first corner portion, the first corner portion is connected between the first light shielding sub-portion and the first width gradient portion, and the first width gradient portion is connected between the first corner portion and the second light shielding sub-portion; the first light shielding sub-portions of the plurality of light shielding portions are arranged in a first direction, and extend in a second direction intersecting with the first direction; and the second light shielding sub-portions of at least two adjacent light shielding portions extend substantially in the same direction, an orthographic projection of the at least one compensation light-shielding portion on the first base substrate is located between orthographic projections of the two adjacent light shielding portions on the first base substrate, an orthographic projection of the at least one compensation light-shielding portion in the second direction overlaps at least partially with an orthographic projection of the first width gradient portion of an $i^{th}$ light shielding portion in the two adjacent light shielding portions in the second direction, an orthographic projection of the at least one compensation light-shielding portion in the first direction overlaps at least partially with an orthographic projection of the first corner portion of a $j^{th}$ light shielding portion in the two adjacent light shielding portions in the first direction, i and j are positive integers, and a corner of the first corner portion of the $i^{th}$ light shielding portion is oriented toward the $j^{th}$ light shielding portion.

According to the embodiments of the present disclosure, the second light shielding sub-portion of the $i^{th}$ light shielding portion is spaced from the second light shielding sub-portion of the $j^{th}$ light shielding portion by a first predetermined distance; in the at least one light shielding portion, the first width gradient portion includes a first end and a second end, a width of the first end is greater than a width of the second end, the first end is connected to the first corner portion, and the second end is connected to the second light shielding sub-portion; and the at least one compensation light-shielding portion is spaced from the first end of the first width gradient portion of the $i^{th}$ light shielding portion by a second predetermined distance, and a ratio of the second predetermined distance to the first predetermined distance is less than or equal to 2:1.

According to the embodiments of the present disclosure, the ratio of the second predetermined distance to the first predetermined distance is greater than or equal to 1.

According to the embodiments of the present disclosure, the at least one compensation light-shielding portion is spaced from the first corner portion of the $j^{th}$ light shielding portion by a third predetermined distance, and a ratio of the third predetermined distance to the first predetermined distance is less than or equal to 2:1.

According to the embodiments of the present disclosure, the ratio of the third predetermined distance to the first predetermined distance is greater than or equal to 1.

According to the embodiments of the present disclosure, the second predetermined distance is equal to the third predetermined distance.

According to the embodiments of the present disclosure, a ratio of the second predetermined distance to a width of the second light shielding sub-portion of the at least one light shielding portion is less than or equal to 2:1.

According to the embodiments of the present disclosure, a side edge of the at least one compensation light-shielding portion close to the $j^{th}$ light shielding portion extends substantially in the same direction as the first light shielding sub-portion of the $j^{th}$ light shielding portion.

According to the embodiments of the present disclosure, the at least one compensation light-shielding portion includes a plurality of compensation light-shielding sub-portions spaced apart, and in the at least one compensation light-shielding portion, an arrangement direction of a column of compensation light-shielding sub-portions close to the $j^{th}$ light shielding portion is substantially parallel to an extension direction of the first light shielding sub-portion of the $j^{th}$ light shielding portion.

According to the embodiments of the present disclosure, the second light shielding sub-portion of the $i^{th}$ light shielding portion is spaced from the second light shielding sub-portion of the $j^{th}$ light shielding portion by a first predetermined distance; and at least two compensation light-shielding sub-portions in the at least one compensation light-shielding portion are spaced by a fourth predetermined distance, and the fourth predetermined distance is greater than or equal to the first predetermined distance.

According to the embodiments of the present disclosure, the mask plate includes at least one first sub-region configured to form at least one fan-out region of the display substrate, the plurality of light shielding portions includes at least one first light shielding portion and at least one second light shielding portion, and the at least one first light shielding portion and the at least one second light shielding portion are located in the first sub-region; for the at least one first sub-region, the at least one first light shielding portion and the at least one second light shielding portion in the at least one first sub-region are symmetrically arranged about a center line of the first sub-region; and a plurality of compensation light-shielding portions include at least one first compensation light-shielding portion and at least one second compensation light-shielding portion, an orthographic projection of the at least one first compensation light-shielding portion on the first base substrate is located between orthographic projections of two adjacent first light shielding portions on the first base substrate, and an orthographic projection of the at least one second compensation light-shielding portion on the first base substrate is located between orthographic projections of two adjacent second light shielding portions on the first base substrate.

According to the embodiments of the present disclosure, for the at least one first sub-region, the at least one first compensation light-shielding portion and the at least one second compensation light-shielding portion are symmetrically arranged about the center line of the first sub-region.

According to the embodiments of the present disclosure, the at least one light shielding portion further includes a second width gradient portion, a second corner portion and a third light shielding sub-portion, the second width gradient portion is connected between the second light shielding sub-portion and the second corner portion, the second corner portion is connected between the second width gradient portion and the third light shielding sub-portion, and the third light shielding sub-portions of the plurality of light shielding portions are arranged in the first direction and extend in the second direction; and an orthographic projection of the at least one compensation light-shielding portion in the second direction overlaps at least partially with an orthographic projection of the second width gradient portion of the $j^{th}$ light shielding portion in the second direction, an orthographic projection of the at least one compensation light-shielding portion in the first direction overlaps at least partially with an orthographic projection of the second corner portion of the $i^{th}$ light shielding portion in the first direction, and a corner of the second corner portion of the $j^{th}$ light shielding portion is oriented toward the $i^{th}$ light shielding portion.

According to a second aspect of the present disclosure, a display substrate is provided, including a display region and a peripheral region located on at least one side of the display region, the display substrate further includes: a second base substrate; a first conductive layer provided on the second base substrate; and a plurality of signal line leads and at least one isolation portion provided in the first conductive layer and located in the peripheral region, and the at least one isolation portion is spaced apart from the plurality of signal line leads, at least one of the signal line leads includes a first lead portion, a third width gradient portion, a second lead portion and a third corner portion, the third corner portion is connected between the first lead portion and the third width gradient portion, and the third width gradient portion is connected between the third corner portion and the second lead portion; the first lead portions of the plurality of signal line leads are arranged in a first direction, and extend in a second direction intersecting with the first direction; and the second lead portions of at least two adjacent signal line leads extend substantially in the same direction, an orthographic projection of the at least one isolation portion on the second base substrate is located between orthographic projections of the two adjacent signal line leads on the second base substrate, an orthographic projection of the at least one isolation portion in the second direction overlaps at least partially with an orthographic projection of the third width gradient portion of an $n^{th}$ signal line lead in the two adjacent signal line leads in the second direction, an orthographic projection of the at least one isolation portion in the first direction overlaps at least partially with an orthographic projection of the third corner portion of an $m^{th}$ signal line lead in the two adjacent signal line leads in the first direction, n and m are positive integers, and a corner of the third corner portion of the $n^{th}$ signal line lead is oriented toward the $m^{th}$ signal line lead; and in the at least one signal line lead, a line width difference at a connection between the third width gradient portion and the second lead portion is less than or equal to 20%.

According to the embodiments of the present disclosure, the second lead portion of the $n^{th}$ signal line lead is spaced from the second lead portion of the $m^{th}$ signal line lead by a fifth predetermined distance; in the at least one signal line lead, the third width gradient portion includes a third end and a fourth end, a width of the third end is greater than a width of the fourth end, the third end is connected to the third corner portion, and the fourth end is connected to the second lead portion; and the at least one isolation portion is spaced from the third end of the third width gradient portion of the $n^{th}$ signal line lead by a sixth predetermined distance, and a ratio of the sixth predetermined distance to the fifth predetermined distance is greater than or equal to 1.

According to the embodiments of the present disclosure, the at least one isolation portion is spaced from the third corner portion of the $m^{th}$ signal line lead by a seventh predetermined distance, and a ratio of the seventh predetermined distance to the fifth predetermined distance is greater than or equal to 1.

According to the embodiments of the present disclosure, the isolation portion includes a plurality of metal portions spaced apart, at least two metal portions are spaced by an eighth predetermined distance, and the eighth predetermined distance is greater than or equal to the fifth predetermined distance.

According to the embodiments of the present disclosure, the at least one signal line lead further includes a fourth width gradient portion, a fourth corner portion and a third lead portion, the fourth width gradient portion is connected between the second lead portion and the fourth corner portion, the fourth corner portion is connected between the fourth width gradient portion and the third lead portion, and the third lead portions of the plurality of signal line leads are arranged in the first direction and extend in the second direction; and in the at least one signal line lead, a line width difference at a connection between the fourth width gradient portion and the second lead portion is less than or equal to 20%.

According to a third aspect of the present disclosure, a display panel is provided, including the display substrate described above.

According to a third aspect of the present disclosure, a display device is provided, including the display panel described above.

BRIEF DESCRIPTION OF THE DRAWINGS

The above contents and other objectives, features and advantages of the present disclosure will be more apparent through the following descriptions of the embodiments of the present disclosure with reference to the accompanying drawings, in which.

DETAILED DESCRIPTION OF EMBODIMENTS

Figure 1:
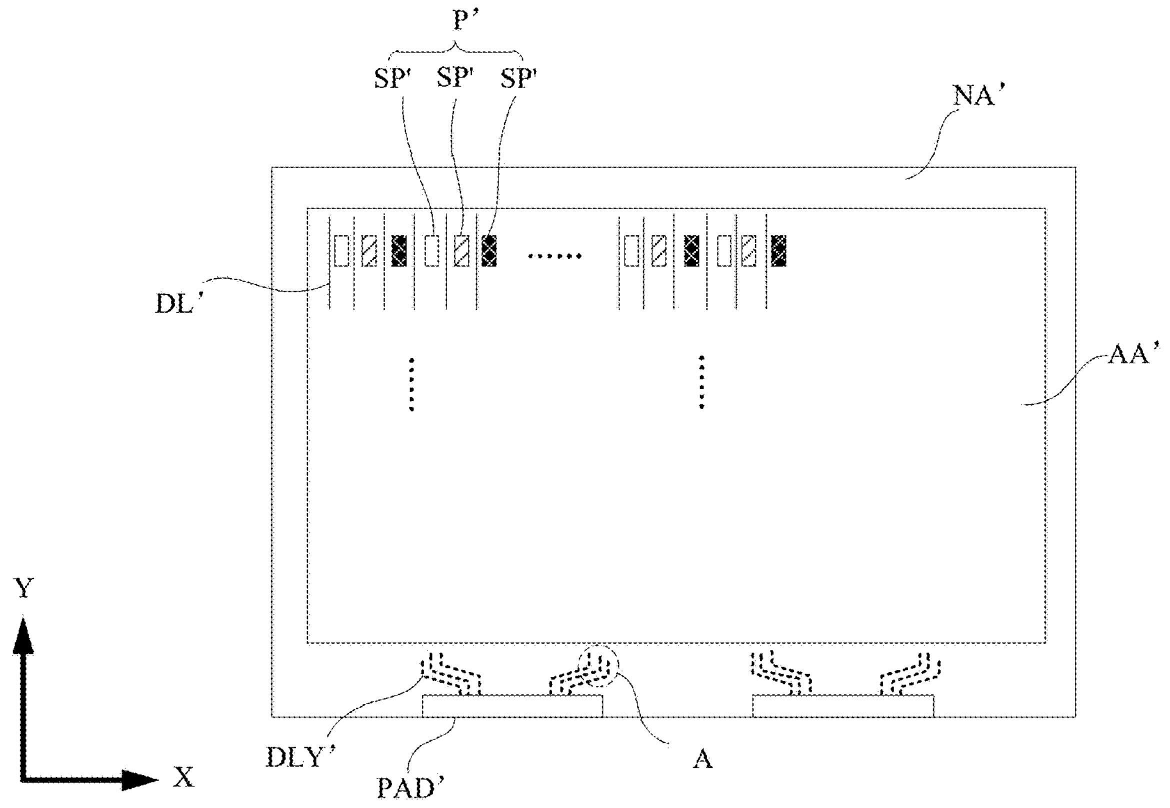
FIG. 1 schematically shows a plan view of a display substrate according to an example.

In order to make objectives, technical solutions and advantages of the embodiments of the present disclosure clearer, technical solutions of the embodiments of the present disclosure will be clearly and completely described below with reference to the accompanying drawings. Obviously, the described embodiments are just some embodiments rather than all embodiments of the present disclosure. Based on the described embodiments of the present disclosure, all additional embodiments obtained by those ordinary skilled in the art without carrying out any inventive effort fall within the scope of protection of the present disclosure.

It should be noted that in the accompanying drawings, for clarity and/or description purposes, a size and a relative size of an element may be enlarged. Accordingly, the size and the relative size of each element are not necessarily limited to those shown in the drawings. In the specification and the accompanying drawings, the same or similar reference numerals represent the same or similar components.

When an element is described as being "on", "connected to" or "coupled to" another element, the element may be directly on the another element, directly connected to the another element, or directly coupled to the another element, or an intermediate element may be provided. However, when an element is described as being "directly on", "directly connected to" or "directly coupled to" another element, no intermediate element is provided. Other terms and/or expressions used to describe a relationship between elements, such as "between" and "directly between", "adjacent to" and "directly adjacent to", "on" and "directly on", and so on, should be interpreted in a similar manner. Moreover, the term "connection" may refer to a physical connection, an electrical connection, a communicative connection, and/or a fluid connection. In addition, X-axis, Y-axis and Z-axis are not limited to three axes of a rectangular coordinate system, but may be interpreted in a broader meaning. For example, the X-axis, the Y-axis and the Z-axis may be perpendicular to each other, or may represent different directions that are not perpendicular to each other. For objectives of the present disclosure, "at least one selected from X, Y or Z" and "at least one selected from a group consisting of X, Y and Z" may be interpreted as only X, only Y, only Z, or any combination of two or more of X, Y and Z, such as XYZ, XYY, YZ and ZZ. As used herein, the term "and/or" includes any and all combinations of one or more of the listed related items.

It should be noted that although the terms "first", "second", etc. may be used here to describe various components, members, elements, regions, layers and/or portions, these components, members, elements, regions, layers and/or portions should not be limited by these terms. Rather, these terms are used to distinguish one component, member, element, region, layer and/or portion from another. Thus, for example, a first component, a first member, a first element, a first region, a first layer and/or a first portion discussed below may be referred to as a second component, a second member, a second element, a second region, a second layer and/or a second portion without departing from teachings of the present disclosure.

For ease of description, spatial relationship terms, such as "upper", "lower", "left", "right", etc. may be used here to describe a relationship between an element or feature and another element or feature as shown in the drawing. It should be understood that the spatial relationship terms are intended to cover other different orientations of a device in use or operation in addition to the orientation described in the drawing. For example, if a device in the drawing is turned upside down, an element or feature described as "below" or "under" another element or feature will be oriented "above" or "on" the another element or feature.

Herein, the terms "substantially", "about", "approximately" "roughly" and other similar terms are used as terms of approximation rather than terms of degree, and they are intended to explain an inherent deviation of a measured or calculated value that will be recognized by those ordinary skilled in the art. Taking into account a process fluctuation, a measurement problem, an error related to a measurement of a specific quantity (that is, a limitation of a measurement system) and other factors, the terms "about" or "approximately" used here includes a stated value and means that a specific value determined by those ordinary skilled in the art is within an acceptable range of deviation. For example, "about" may mean being within one or more standard deviations, or within ±30%, ±20%, ±10% or ±5% of the stated value.

It should be noted that the expression "the same layer" herein refers to a layer structure that is formed by firstly forming, using a same film forming process, a film layer used to form a specific pattern, and then patterning, using an one-time patterning process, the film layer with a same mask. Depending on different specific patterns, the one-time patterning process may include a plurality of exposure, development or etching processes, and the specific pattern in the formed layer structure may be continuous or discontinuous. That is, a plurality of elements, components, structures and/or portions located in the "same layer" are made of the same material and formed by the same patterning process. Generally, a plurality of elements, components, structures and/or portions located in the "same layer" have substantially the same thickness.

Those skilled in the art should understand that, unless otherwise specified, the expression "height" or "thickness" herein refers to a size in a direction perpendicular to a surface of each film layer provided on the display substrate, that is, a size in a light emitting direction of the display substrate, or referred to as a size in a normal direction of the display device.

FIG. 1 schematically shows a plan view of a display substrate according to an example.

Referring to FIG. 1, in this example, a display substrate includes a display region AA' and a peripheral region NA' located on at least one side of the display region AA'. The display substrate further includes a plurality of pixel units P' and a plurality of data lines DL', which are located in the display region AA'. Each pixel unit P' includes a plurality of sub-pixels SP', and a data line DL' is electrically connected to at least one column of sub-pixels SP'. The data lines DL' in the display region AA' are arranged in a first direction X in the display region AA', and extend in a second direction Y intersecting with the first direction X. The data lines DL' are connected to data line leads DLY' in the peripheral region NA' after extending to the peripheral region NA'. The data lines DL' are electrically connected to a pad PAD' through the data line leads DLY', and then connected to a driver chip (not shown), which is used to provide a data driving signal, through the pad PAD'.

Figure 2:
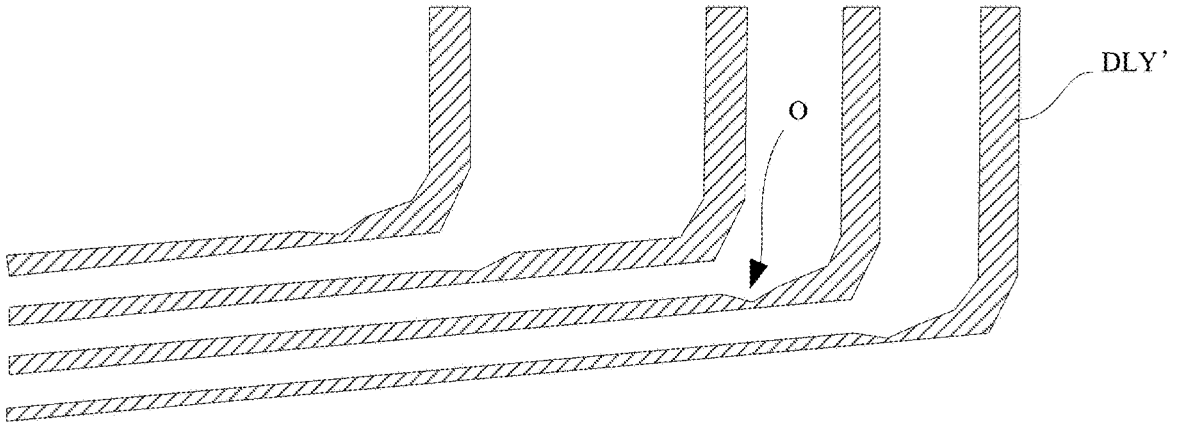
FIG. 2 schematically shows a schematic diagram of position A in FIG. 1.

FIG. 2 schematically shows a schematic diagram of position A in FIG. 1. With reference to FIG. 1 and FIG. 2, in order to converge a plurality of data line leads DLY' before connecting to the pad PAD', the data line lead DLY' includes at least one inflection point, at which the data line lead DLY' is narrowed, so that portions of the plurality of data line leads DLY' after the inflection points may be arranged at a higher density.

With a higher resolution of the display substrate, the data line lead DLY' in the display substrate becomes thinner, and a line distance becomes smaller. Then, in a patterning process, it is easy to cause a defect at a position where the data line lead DLY' is narrowed. This is mainly because a photoresist used to cover a narrowed portion of the data line lead DLY' is easy to be missing in a lithographic process. Taking a positive photoresist as an example, in the lithographic process, a photoresist is formed above the data line lead DLY'. After exposure and development, a part of the photoresist may be removed so that the photoresist may form a specific pattern. The photoresist having the specific pattern is used as a mask in a subsequent etching process to form the data line lead DLY'.

Referring to FIG. 2, two data line leads DLY' are converged after their respective inflection points, and the data line leads DLY' are gradually narrowed after the inflection points.

Figure 3:
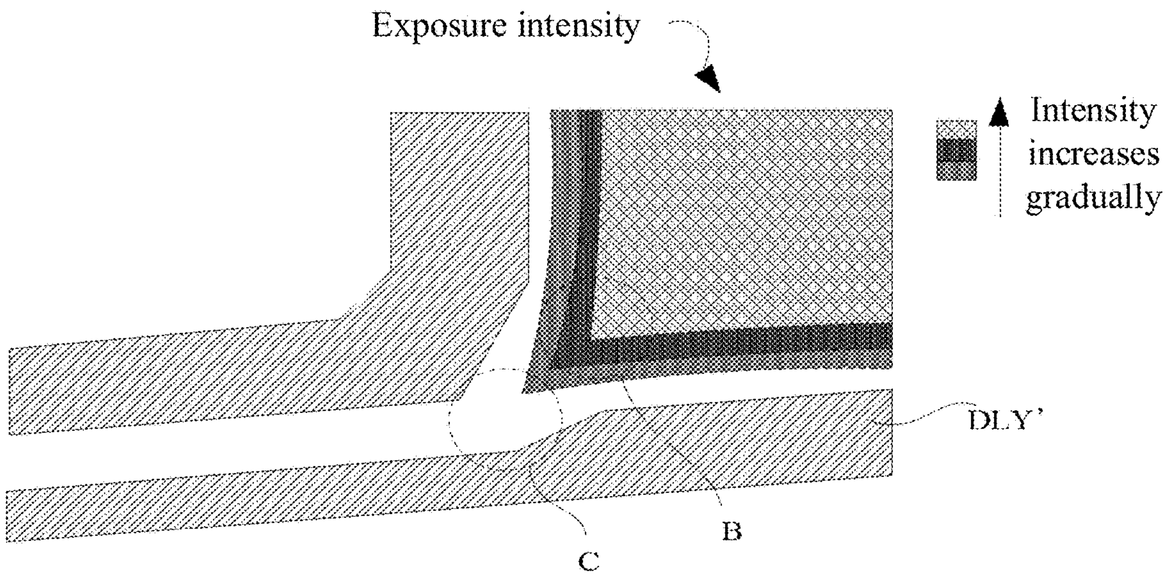
FIG. 3 schematically shows a schematic diagram of an exposure intensity distribution according to an example.

FIG. 3 schematically shows a schematic diagram of an exposure intensity distribution according to an example. With reference to FIG. 2 and FIG. 3, during exposure, an exposure intensity at position B is large due to a large distance between two data line leads DLY' at position B. Position C is immediately adjacent to position B, which may cause an exposure intensity at position C higher than expected. After development, the photoresist at position C may be missing. Accordingly, in a subsequent etching process, a conductive material used to form the data line lead DLY' at position C may be lack of shielding of the photoresist, then the finally formed data line lead DLY' may be too thin (for example, a depression O in FIG. 2 may be formed), which may easily result in a broken line, and further lead to a display defect.

Figure 4:
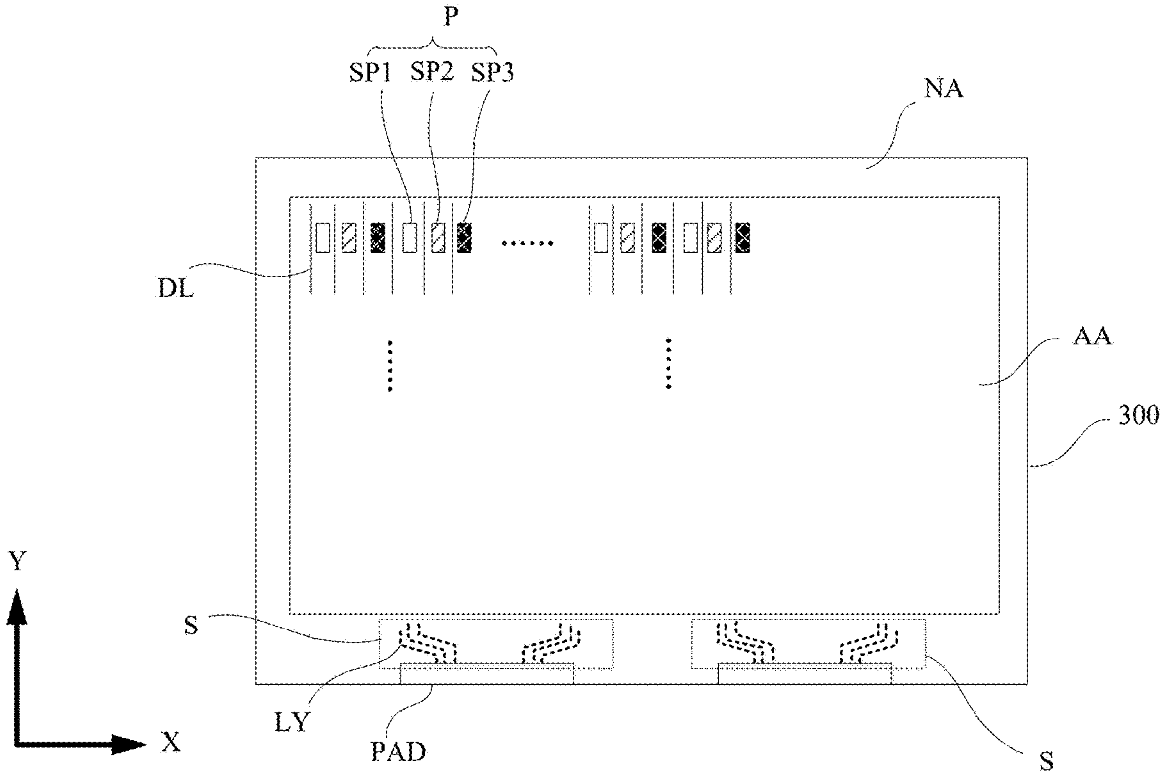
FIG. 4 schematically shows a first schematic diagram of a display substrate according to the embodiments of the present disclosure.
Figure 5:
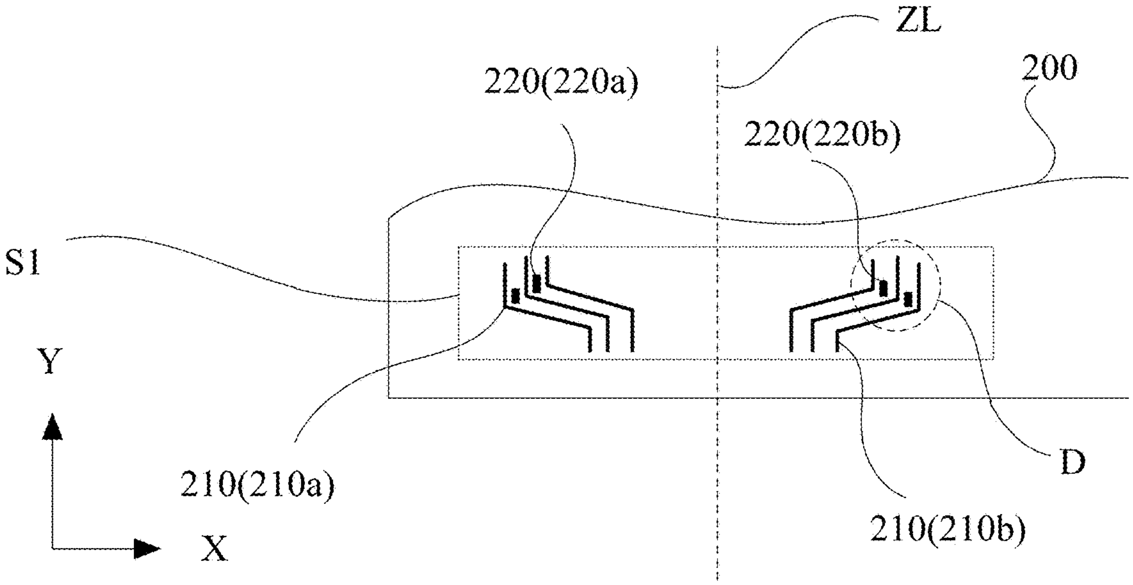
FIG. 5 schematically shows a schematic diagram of a mask plate according to the embodiments of the present disclosure.

In view of this, the embodiments of the present disclosure provide a mask plate. FIG. 4 schematically shows a first schematic diagram of a display substrate according to the embodiments of the present disclosure. FIG. 5 schematically shows a schematic diagram of a mask plate according to the embodiments of the present disclosure. With reference to FIG. 4 and FIG. 5 in combination, the mask plate of the embodiments of the present disclosure includes a first base substrate 200, a light shielding layer provided on the first base substrate 200, a plurality of light shielding portions 210 and at least one compensation light-shielding portion 220 that are located in the light shielding layer. At least one of the light shielding portions 210 is used to form at least one signal line lead LY in a fan-out region S of the display substrate, and the at least one compensation light-shielding portion 220 is spaced apart from the plurality of light shielding portions 210.

Figure 6:
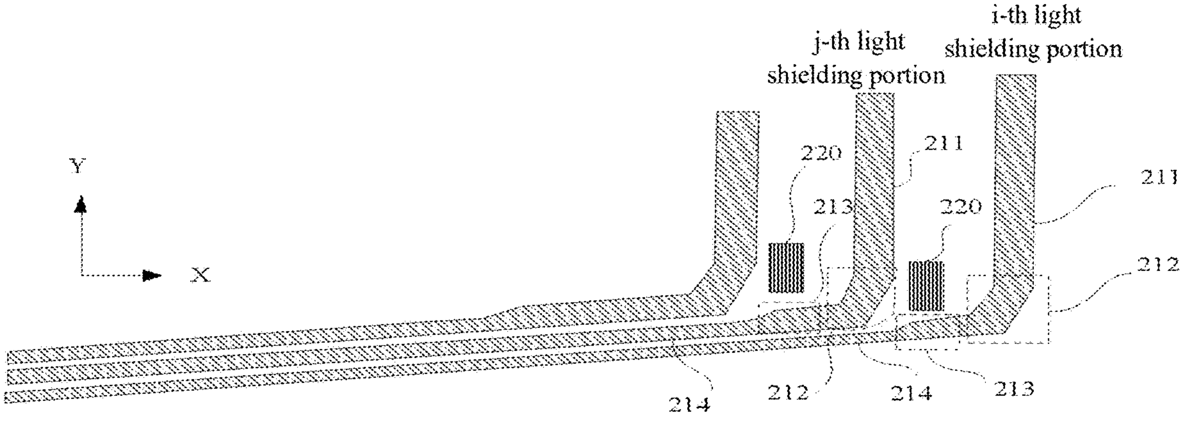
FIG. 6 schematically shows a schematic diagram of position D in FIG. 5.

FIG. 6 schematically shows a schematic diagram of position D in FIG. 5. With reference to FIG. 4 to FIG. 6 in combination, at least one light shielding portion 210 includes a first light shielding sub-portion 211, a first width gradient portion 213, a second light shielding sub-portion 214, and a first corner portion 212. The first corner portion 212 is connected between the first light shielding sub-portion 211 and the first width gradient portion 213, and the first width gradient portion 213 is connected between the first corner portion 212 and the second light shielding sub-portion 214. The first light shielding sub-portions 211 of the plurality of light shielding portions 210 are arranged in the first direction X, and extend in the second direction Y intersecting with the first direction X. The second light shielding sub-portions 214 of at least two adjacent light shielding portions 210 extend substantially in the same direction. An orthographic projection of the at least one compensation light-shielding portion 220 on the first base substrate 200 is located between orthographic projections of the two adjacent light shielding portions 210 on the first base substrate 200. An orthographic projection of the at least one compensation light-shielding portion 220 in the second direction Y overlaps at least partially with an orthographic projection of the first width gradient portion 213 of an $i^{th}$ light shielding portion 210 in the two adjacent light shielding portions 210 in the second direction Y. An orthographic projection of the compensation light-shielding portion 220 in the first direction X overlaps at least partially with an orthographic projection of the first corner portion 212 of a $j^{th}$ light shielding portion 210 in the two adjacent light shielding portions 210 in the first direction X. i and j are positive integers. A corner of the first corner portion 212 of the $i^{th}$ light shielding portion 210 is oriented toward the $j^{th}$ light shielding portion 210.

Figure 7:
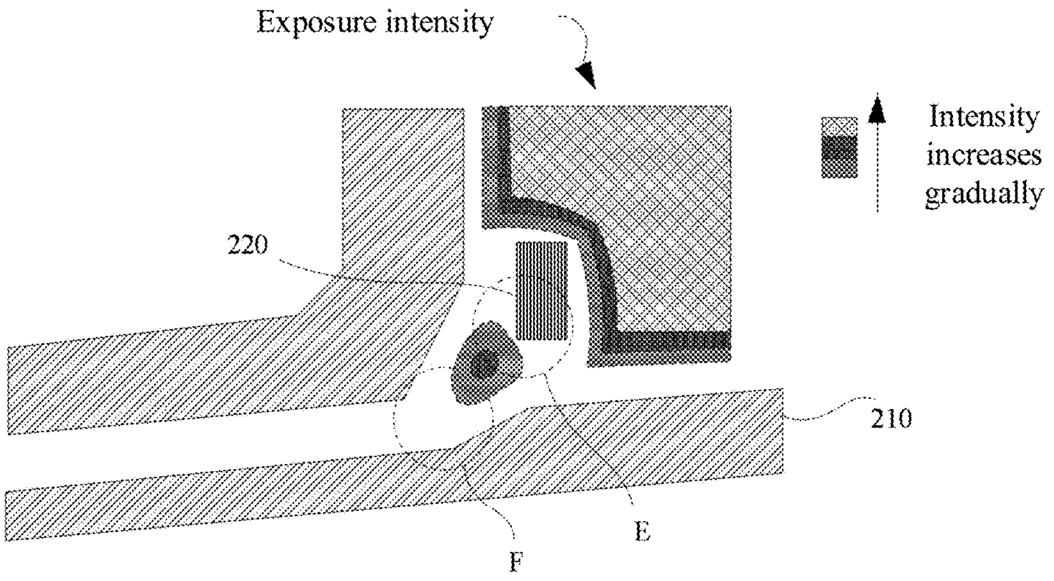
FIG. 7 schematically shows a schematic diagram of an exposure intensity distribution according to the embodiments of the present disclosure.

In the mask plate of the embodiments of the present disclosure, the compensation light-shielding portion 220 is added between the first corner portions 212 and the first width gradient portions 213 of two adjacent light shielding portions 210. FIG. 7 schematically shows a schematic diagram of an exposure intensity distribution according to the embodiments of the present disclosure. With reference to FIG. 4 to FIG. 7 in combination, during exposure, the compensation light-shielding portion 220 may block light to a certain extent, so that an exposure intensity at position E (i.e., position B in FIG. 3) may be reduced, then an exposure intensity at position F immediately adjacent to position E may be prevented from being higher than expected, and the problem of missing photoresist caused by this may be avoided. Accordingly, during the etching process, a conductive material used to form the signal line lead LY at position F may be effectively covered by the photoresist, so that the problem of too thin or even broken signal line lead LY at position F may be avoided, and a product yield may be improved.

A detailed explanation of the mask plate of the embodiments of the present disclosure will be provided below with reference to FIG. 4 to FIG. 16 in combination.

The embodiments of the present disclosure provide a mask plate, including a first base substrate 200, a light shielding layer provided on the first base substrate 200, a plurality of light shielding portions 210 and at least one compensation light-shielding portion 220 that are located in the light shielding layer. At least one of the light shielding portions 210 is used to form at least one signal line lead LY in a fan-out region S of the display substrate, and the at least one compensation light-shielding portion 220 is spaced apart from the light shielding portions 210.

In the embodiments of the present disclosure, structures located in a same film layer are made of the same material, for example, the plurality of light shielding portions 210 and the at least one compensation light-shielding portion 220 are made of a same light shielding material. Optionally, the signal line lead LY located in the fan-out region S on the display substrate is used to electrically connect the signal line in the display region AA to the pad PAD, and then electrically connect the signal line to a driver chip, which is used to provide a driving signal, through the pad PAD. For example, the signal line lead LY may include a data line lead. For the sake of simplicity, the signal line lead LY being a data line lead is taken as an example in the following descriptions. It should be understood that the signal line lead LY in the embodiments of the present disclosure may also refer to other leads, such as an initialization signal line, etc.

In the embodiments of the present disclosure, the light shielding portion 210 has a first pattern. In the lithographic process, the light shielding portion 210 may block light during exposure, so that the photoresist located below the light shielding portion 210 is not subjected to irradiation. Then, after development, the photoresist subjected to irradiation may be removed, while the photoresist not subjected to irradiation may be retained. In this way, the retained photoresist may also have the first pattern. It should be noted that, unless otherwise specified, the photoresists mentioned in the embodiments of the present disclosures are all positive photoresists, which will not be repeated below.

Afterwards, a material used to form the signal line lead LY is etched using the photoresist having the first pattern as a mask plate. A portion not covered by the photoresist may be removed after the etching process, and a portion covered by the photoresist may be retained. Accordingly, a signal line lead LY having the first pattern may be obtained after etching.

In the embodiments of the present disclosure, the light shielding portion 210 may extend to a region of the mask plate used to form the display region AA of the display substrate, so as to form other structures in the display region AA while forming the signal line lead LY in the peripheral region NA of the display substrate. For example, when forming the signal line lead LY in the peripheral region NA of the display substrate, it is also possible to form a corresponding signal line in the display region AA (for example, forming a data line DL while forming the data line lead). In this way, the signal line and the signal line lead LY may be formed by a one-step patterning process. Certainly, in some embodiments, the signal line and the signal line lead LY on the display substrate may also be formed by a multi-step patterning process, in other words, the signal line and the signal line lead LY on the display substrate are located in different film layers and may be electrically connected by an adapter.

Moreover, other light shielding portions used to form other structures on the display substrate may be further provided on the mask plate. Other structures here specifically refer to structures on the display substrate that are located in the same layer and made of the same material as the signal line lead LY. For example, other structures here may include source electrodes or drain electrodes of some transistors in the display substrate, or an adapter used to electrically connect components in different film layers. Through these other light shielding portions, the above-mentioned structures and the signal line lead LY may be formed by a one-step patterning process.

At least one light shielding portion 210 includes a first light shielding sub-portion 211, a first corner portion 212, a first width gradient portion 213, and a second light shielding sub-portion 214. The first corner portion 212 is connected between the first light shielding sub-portion 211 and the first width gradient portion 213, and the first width gradient portion 213 is connected between the first corner portion 212 and the second light shielding sub-portion 214. The first light shielding sub-portions 211 of a plurality of light shielding portions 210 are arranged in the first direction X, and extend in the second direction Y intersecting with the first direction X.

In the mask plate, the first direction X may refer to a horizontal direction in FIG. 5, and the second direction Y may refer to a vertical direction in FIG. 5, that is, the first direction X is perpendicular to the second direction Y.

In the embodiments of the present disclosure, the light shielding portion 210 is bent in a predetermined direction through the first corner portion 212, so that the plurality of light shielding portions 210 may be converged after being bent. The light shielding portion 210 may be narrowed through the first width gradient portion 213, so that the plurality of light shielding portions 210 may be arranged in a closer manner after being bent through the first corner portions 212.

In the embodiments of the present disclosure, the second light shielding sub-portions 214 of at least two adjacent light shielding portions 210 extend substantially in the same direction. An orthographic projection of the at least one compensation light-shielding portion 220 on the first base substrate 200 is located between orthographic projections of the two adjacent light shielding portions 210 on the first base substrate 200. An orthographic projection of the at least one compensation light-shielding portion 220 in the second direction Y overlaps at least partially with an orthographic projection of the first width gradient portion 213 of an $i^{th}$ light shielding portion 210 in the two adjacent light shielding portions 210 in the second direction Y. An orthographic projection of the compensation light-shielding portion 220 in the first direction X overlaps at least partially with an orthographic projection of the first corner portion 212 of a $j^{th}$ light shielding portion 210 in the two adjacent light shielding portions 210 in the first direction X. i and j are positive integers. A corner of the first corner portion 212 of the $i^{th}$ light shielding portion 210 is oriented toward the $j^{th}$ light shielding portion 210.

In the embodiments of the present disclosure, the mask plate includes a first sub-region S1 corresponding to the fan-out region S on the display substrate. A plurality of light shielding portions 210 located in the first sub-region S1 may be symmetrically arranged about a center line ZL of the first sub-region S1. For example, the plurality of light shielding portions 210 include at least one first light shielding portion 210*a* and at least one second light shielding portion 210*b*. The first light shielding portion 210*a* is located on a left side of the center line ZL of the first sub-region S1, and the second light shielding portion 210*b* is located on a right side of the center line ZL of the first sub-region S1. The second light shielding portions 214 of the light shielding portions 210 located on the same side of the center line ZL extend substantially in the same direction. For clarity, unless otherwise specified, the second light shielding portion 210*b* is illustrated by way of example in describing the mask plate of the embodiments of the present disclosure.

In the embodiments of the present disclosure, two adjacent light shielding portions 210 specifically refer to two light shielding portions 210 between which no other light shielding portions 210 are provided. Referring to FIG. 6, the $i^{th}$ light shielding portion 210 is located on the right side of the $j^{th}$ light shielding portion 210, and the corner of the first corner portion 212 of the $i^{th}$ light shielding portion 210 is oriented leftward, that is, toward the $j^{th}$ light shielding portion 210.

In the embodiments of the present disclosure, the compensation light-shielding portion 220 is located above and immediately adjacent to the first width gradient portion 213 of the $i^{th}$ light shielding portion 210, and also located on the right side of and immediately adjacent to the first corner portion 212 of the $j^{th}$ light shielding portion 210.

In the embodiments of the present disclosure, the first width gradient portion 213 has a first end and a second end, and the first end is wider than the second end. The first end is connected to the first corner portion 212, and the second end is connected to the second light shielding sub-portion 214. A width of the second end is substantially the same as that of the second light shielding sub-portion 214. In this way, the plurality of light shielding portions 210 may be bent at the first corner portions 212 and then narrowed at the first width gradient portions 213, so that the second light shielding sub-portions 214 of the plurality of light shielding portions 210 may be arranged side by side in a closer manner, and the plurality of light shielding portions 210 may be converged.

In the embodiments of the present disclosure, the compensation light-shielding portion 220 is used to compensate for a case where the signal line lead LY is too thin after being narrowed. Specifically, during exposure, the compensation light-shielding portion 220 may block light to a certain extent, so that the exposure intensity at position E (i.e., position B in FIG. 3) may be reduced, then the exposure intensity at position F immediately adjacent to position E may be prevented from being higher than expected, and the problem of missing photoresist caused by this may be avoided. In this way, during the etching process, the conductive material used to form the signal line lead LY at position F may be effectively covered by the photoresist, so that the problem of too thin or even broken signal line lead LY at position F may be avoided, and a product yield may be improved.

A further explanation of the mask plate in the embodiments of the present disclosure will be provided below.

Figure 8:
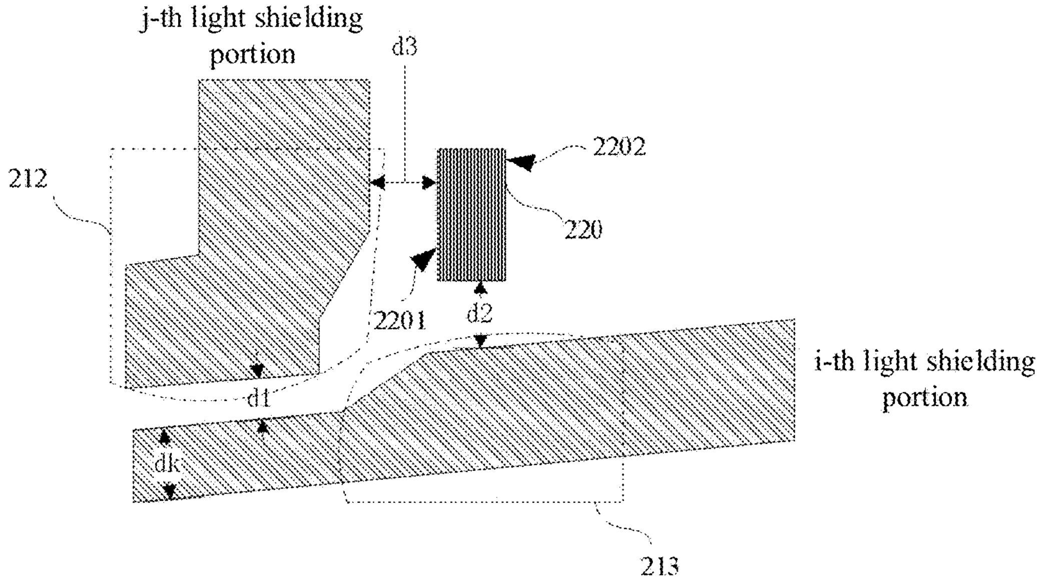
FIG. 8 schematically shows a schematic diagram of a predetermined distance according to the embodiments of the present disclosure.

FIG. 8 schematically shows a schematic diagram of a predetermined distance according to the embodiments of the present disclosure.

With reference to FIG. 4 to FIG. 8, in some specific embodiments, a first predetermined distance d1 is formed between the second light shielding sub-portion 214 of the $i^{th}$ light shielding portion 210 and the second light shielding sub-portion 214 of the $j^{th}$ light shielding portion 210. In at least one light shielding portion 210, the first width gradient portion 213 includes the first end and the second end, and the width of the first end is greater than that of the second end. The first end is connected to the first corner portion 212, and the second end is connected to the second light shielding sub-portion 214. A second predetermined distance d2 is formed between the at least one compensation light-shielding portion 220 and the first end of the first width gradient portion 213 of the $i^{th}$ light shielding portion 210. A ratio of the second predetermined distance d2 to the first predetermined distance d1 is less than or equal to 2:1.

As described above, the plurality of light shielding portions 210 may include a first light shielding portion 210*a* and a second light shielding portion 210*b* symmetrically arranged, and the first light shielding portion 210*a* and the second light shielding portion 210*b* are symmetrically arranged about the center line ZL of the first sub-region S1. For a plurality of first light shielding portions 210*a* located on the left side of the center line ZL of the first sub-region S1, the second light shielding sub-portions 214 of these first light shielding portions 210*a* extend substantially in the same direction, that is, the second light shielding sub-portions 214 of these first light shielding portions 210*a* are arranged in parallel. Correspondingly, for a plurality of second light shielding portions 210*b* located on the right side of the center line ZL of the first sub-region S1, the second light shielding sub-portions 214 of these second light shielding portions 210*b* extend substantially in the same direction, that is, the second light shielding sub-portions 214 of these second light shielding portions 210*b* are arranged in parallel.

Taking the second light shielding portion 210*b* as an example, for two adjacent second light shielding portions 210*b*, the second light shielding sub-portion 214 of the $i^{th}$ second light shielding portion 210*b* and the second light shielding sub-portion 214 of the $j^{th}$ second light shielding portion 210*b* are parallel to each other, and a first predetermined distance d1 is formed between the two. The first predetermined distance d1 may refer to an average distance between the two second light shielding sub-portions 214.

The at least one compensation light-shielding portion 220 is arranged adjacent to the first width gradient portion 213 of at least one light shielding portion 210 in the second direction Y. Here, being arranged adjacent to may refer to that no other compensation light-shielding portions 220 or first width gradient portions 213 are provided between the compensation light-shielding portion 220 and the first width gradient portion 213.

In the embodiments of the present disclosure, the first width gradient portion 213 adjacent to the compensation light-shielding portion 220 in the second direction Y may be the first width gradient portion 213 located below the compensation light-shielding portion 220, that is, for the compensation light-shielding portion 220 located between the $i^{th}$ light shielding portion 210 and the $j^{th}$ light shielding portion 210, the first width gradient portion 213 adjacent to the compensation light-shielding portion 220 in the second direction Y may be the first width gradient portion 213 of the $i^{th}$ light shielding portion 210. A second predetermined distance d2 is formed between the compensation light-shielding portion 220 and the first end of the first width gradient portion 213. The second predetermined distance d2 may refer to an average distance between the compensation light-shielding portion 220 and the first end of the first width gradient portion 213.

In the embodiments of the present disclosure, a size of the second predetermined distance d2 may be set according to a size of the first predetermined distance d1, as long as the ratio of the second predetermined distance d2 to the first predetermined distance d1 being less than or equal to 2:1. For example, the first predetermined distance d1 may be 2.8 μm, and the second predetermined distance d2 may be less than or equal to 4 μm. For example, the second predetermined distance d2 may be 3.3 μm. In this way, the compensation light-shielding portion 220 located between the $i^{th}$ light shielding portion 210 and the $j^{th}$ light shielding portion 210 is not distanced too far from the first width gradient portion 213 of the $i^{th}$ light shielding portion 210, so that the compensation light-shielding portion 220 may effectively reduce the exposure intensity above the first width gradient portion 213 of the light shielding portion 210, thereby improving the resulting problem of too thin or even broken signal line lead LY.

In some specific embodiments, the ratio of the second predetermined distance d2 to the first predetermined distance d1 is greater than or equal to 1.

In the embodiments of the present disclosure, due to an additional provision of the compensation light-shielding portion 220, a residual material (hereinafter referred to as an isolation portion) may be left at a corner of the signal line lead LY corresponding to the compensation light-shielding portion 220 after a patterning process is performed on the display substrate using the mask plate of the embodiments of the present disclosure. In order to ensure that the isolation portion does not interfere with the signal line lead LY, the second predetermined distance d2 should not be too small.

For example, the second predetermined distance d2 may be greater than or equal to the first predetermined distance d1. In other words, for the compensation light-shielding portion 220 located between the $i^{th}$ light shielding portion 210 and the $j^{th}$ light shielding portion 210, the distance between the compensation light-shielding portion 220 and the second end of the first width gradient portion 213 of the $i^{th}$ second light shielding portion 210*b* is greater than or equal to the distance between the second light shielding sub-portions 214 of any two adjacent light shielding portions 210. In this way, the distance between the compensation light-shielding portion 220 and the first width gradient portion 213 of the $i^{th}$ light shielding portion 210 may not be too small, so that the compensation light-shielding portion 220 may effectively reduce the exposure intensity above the first width gradient portion 213 of the $i^{th}$ light shielding portion 210, and also maintain a certain distance from the first width gradient portion 213 of the $i^{th}$ light shielding portion 210. In this way, even if an isolation portion is left after the patterning process is performed on the display substrate using the mask plate of the embodiments of the present disclosure, the isolation portion may still be spaced apart from the signal line lead LY that is formed based on the $i^{th}$ light shielding portion 210, thereby preventing the isolation portion from affecting a morphology or electrical performance of the signal line lead LY.

In some specific embodiments, a third predetermined distance d3 is formed between the at least one compensation light-shielding portion 220 and the first corner portion 212 of the $j^{th}$ light shielding portion 210, and a ratio of the third predetermined distance d3 to the first predetermined distance d1 is less than or equal to 2:1.

The first corner portion 212 closest to the compensation light-shielding portion 220 in the first direction X may refer to the first corner portion 212 of the light shielding portion 210 located on the left side of the compensation light-shielding portion 220 or the first corner portion 212 of the second light shielding portion 210*b* located on the right side of the compensation light-shielding portion 220, which depends on whether the compensation light-shielding portion 220 is located between two adjacent first light shielding portions 210*a* or two adjacent second light shielding portions 210*b*.

For example, for the compensation light-shielding portion 220 located between the $i^{th}$ second light shielding portion 210*b* and the $j^{th}$ second light shielding portion 210*b*, the first corner portion 212 closest to the compensation light-shielding portion 220 in the first direction X may refer to the first corner portion 212 of the second light shielding portion 210*b* on the left side of the compensation light-shielding portion 220, that is, the first corner portion 212 of the $j^{th}$ second light shielding portion 210*b*. The third predetermined distance d3 may refer to an average distance between the compensation light-shielding portion 220 and the first corner portion 212. It should be understood that for the compensation light-shielding portion 220 located between the $i^{th}$ first light shielding portion 210*a* and the $j^{th}$ first light shielding portion 210*a*, the first corner portion 212 closest to the compensation light-shielding portion 220 in the first direction X may refer to the first corner portion 212 of the first light shielding portion 210*a* on the right side of the compensation light-shielding portion 220.

In the embodiments of the present disclosure, a size of the third predetermined distance d3 may be set according to the size of the first predetermined distance d1, as long as the ratio of the third predetermined distance d3 to the first predetermined distance d1 being less than or equal to 2:1. For example, the first predetermined distance d1 may be 2.8 μm, and the third predetermined distance d3 may be less than or equal to 4 μm. For example, the third predetermined distance d3 may be 3.3 μm. In this way, the compensation light-shielding portion 220 located between the $i^{th}$ light shielding portion 210 and the $j^{th}$ light shielding portion 210 is not distanced too far from the first corner portion 212 of the $j^{th}$ light shielding portion 210, so that the compensation light-shielding portion 220 may effectively reduce the exposure intensity above the second end of the first width gradient portion 213 of the $i^{th}$ light shielding portion 210, thereby improving the resulting problem of too thin or even broken signal line lead LY.

In some specific embodiments, the ratio of the third predetermined distance d3 to the first predetermined distance d1 is greater than or equal to 1.

In the embodiments of the present disclosure, due to an additional provision of the compensation light-shielding portion 220, a residual material may be left at the corner of the signal line lead LY corresponding to the compensation light-shielding portion 220 after the patterning process is performed on the display substrate using the mask plate of the embodiments of the present disclosure. Therefore, in the embodiments of the present disclosure, the third predetermined distance d3 should not be too small.

For example, the third predetermined distance d3 may be greater than or equal to the first predetermined distance d1. In other words, for the compensation light-shielding portion 220 located between the $i^{th}$ light shielding portion 210 and the $j^{th}$ light shielding portion 210, the distance between the compensation light-shielding portion 220 and the first corner portion 212 of the $j^{th}$ light shielding portion 210 is greater than or equal to the distance between the second light shielding sub-portions 214 of any two adjacent light shielding portions 210. In this way, the distance between the compensation light-shielding portion 220 and the first corner portion 212 of the $j^{th}$ light shielding portion 210 may not be too small, so that the compensation light-shielding portion 220 may effectively reduce the exposure intensity above the first width gradient portion 213 of the $i^{th}$ light shielding portion 210, and also maintain a certain distance from the first corner portion 212 of the $j^{th}$ light shielding portion 210. In this way, even if an isolation portion is left after the patterning process is performed on the display substrate using the mask plate of the embodiments of the present disclosure, the isolation portion may still be spaced apart from the signal line lead LY that is formed based on the $j^{th}$ light shielding portion 210, thereby preventing the isolation portion from affecting the morphology or electrical performance of the signal line lead LY.

In some specific embodiments, the second predetermined distance d2 is equal to the third predetermined distance d3. In this way, for the compensation light-shielding portion 220 located between the $i^{th}$ light shielding portion 210 and the $j^{th}$ light shielding portion 210, the distance between the compensation light-shielding portion 220 and the first width gradient portion 213 of the $i^{th}$ light shielding portion 210 may be substantially the same as the distance between the compensation light-shielding portion 220 and the first corner portion 212 of the $j^{th}$ light shielding portion 210, so that a distance between the signal line lead LY formed based on the $i^{th}$ light shielding portion 210 and the isolation portion is substantially the same as a distance between the signal line lead LY formed based on the $j^{th}$ light shielding portion 210 and the isolation portion, which is beneficial for a uniformity of electrical performance and other parameters between the two signal line leads LY.

In some specific embodiments, a ratio of the second predetermined distance d2 to a width dk of the second light shielding sub-portion 214 of at least one light shielding portion 210 is less than or equal to 2:1.

In the embodiments of the present disclosure, the width dk of the second light shielding portion 214 may refer to an average width that the light shielding portion 210 may reach after being narrowed at the first width gradient portion 213. Optionally, in some specific embodiments, the second predetermined distance d2 is substantially the same as the third predetermined distance d3. Therefore, in these embodiments, a ratio of the third predetermined distance d3 to the width dk of the second light shielding sub-portion 214 of the at least one light shielding portion 210 is also less than or equal to 2:1. In this way, the second predetermined distance d2 and the third predetermined distance d3 are set by comprehensively considering the line widths and the line distances of the second light shielding sub-portions 214 of the light shielding portions 210, so that the distance between the compensation light-shielding portion 220 and the light shielding portion 210 may adapt to an original accuracy of the mask plate, then the additional provision of the compensation light-shielding portion 220 does not need any additional adjustment of the mask plate, and a process difficulty may be reduced.

In the embodiments of the present disclosure, in addition to the ratio relationships mentioned above, the first predetermined distance d1, the second predetermined distance d2 and the third predetermined distance d3 may further have other numerical relationships. For example, a difference between the first predetermined distance d1 and either the second predetermined distance d2 or the third predetermined distance d3 should be less than or equal to a predetermined value. For example, when the first predetermined distance d1 is 2.8 μm, the predetermined value may be 5 μm.

In some specific embodiments, a side edge 2201 of the at least one compensation light-shielding portion 220 close to the $j^{th}$ light shielding portion 210 extends substantially in the same direction as the first light shielding sub-portion 211 of the $j^{th}$ light shielding portion 210.

In the embodiments of the present disclosure, a side edge 2202 of the at least one compensation light-shielding portion 220 away from the $j^{th}$ light shielding portion 210 may also extend substantially in the same direction as the first light shielding sub-portion 211 of the $j^{th}$ light shielding portion 210. In this way, that side edge of the compensation light-shielding portion 220 may be arranged parallel to the first light shielding sub-portion 211, which helps to maintain a uniform distance between the compensation light-shielding portion 220 and the adjacent first light shielding portion 211, and prevent an interference from the compensation light-shielding portion 220 on a pattern of the signal line lead LY formed based on the first light shielding portion 211 in the patterning process.

In the embodiments of the present disclosure, the compensation light-shielding portion 220 may be of various shapes. A shape of the compensation light-shielding portion 220 may be specifically determined according to a corner manner of the light shielding portion 210, so that the compensation light-shielding portion 220 may adapt to the light shielding portion 210 adjacent to the compensation light-shielding portion 220 to a great extent.

Figure 9:
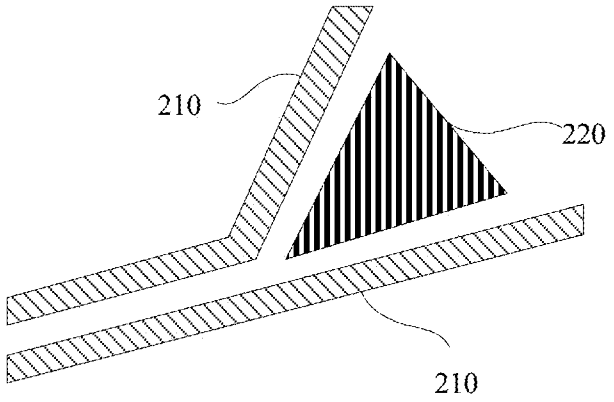
FIG. 9 to FIG. 15 schematically show schematic diagrams of shapes of a compensation light-shielding portion according to the embodiments of the present disclosure.

For example, the shape of the compensation light-shielding portion 220 may include a plate shape or a plurality of block shapes spaced apart from each other. For example, FIG. 9 to FIG. 15 schematically show schematic diagrams of shapes of the compensation light-shielding portion according to the embodiments of the present disclosure. Referring to FIG. 9, when the shape of the compensation light-shielding portion 220 includes a plate shape and the corner of the light shielding portion 210 is an obtuse angle, the shape of the compensation light-shielding portion 220 may include an acute triangle.

Figure 10:
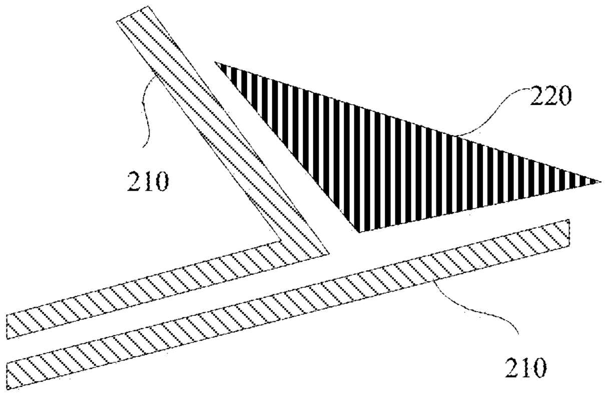

For another example, as shown in FIG. 10, when the shape of the compensation light-shielding portion 220 includes a plate shape and the corner of the light shielding portion 210 is an acute angle, the shape of the compensation light-shielding portion 220 may include an obtuse triangle.

Figure 11:
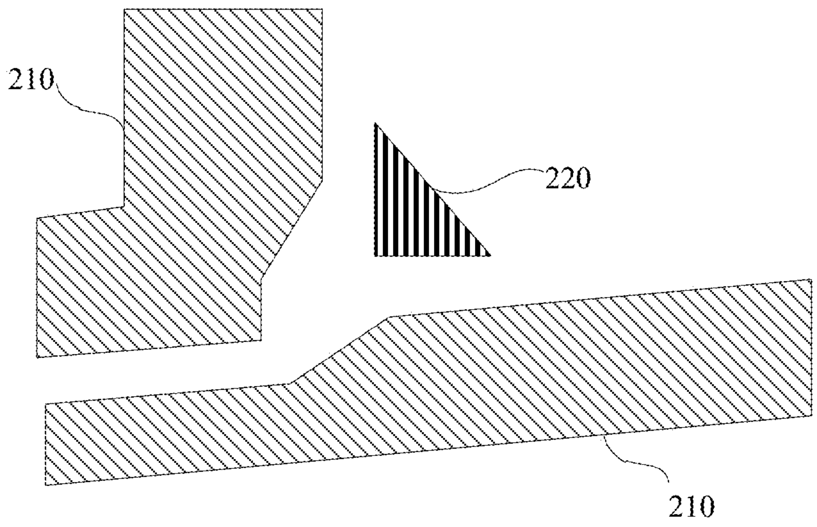

For another example, as shown in FIG. 11, when the shape of the compensation light-shielding portion 220 includes a plate shape and the corner of the light shielding portion 210 is close to a right angle, the shape of the compensation light-shielding portion 220 may include a right triangle.

Figure 12:
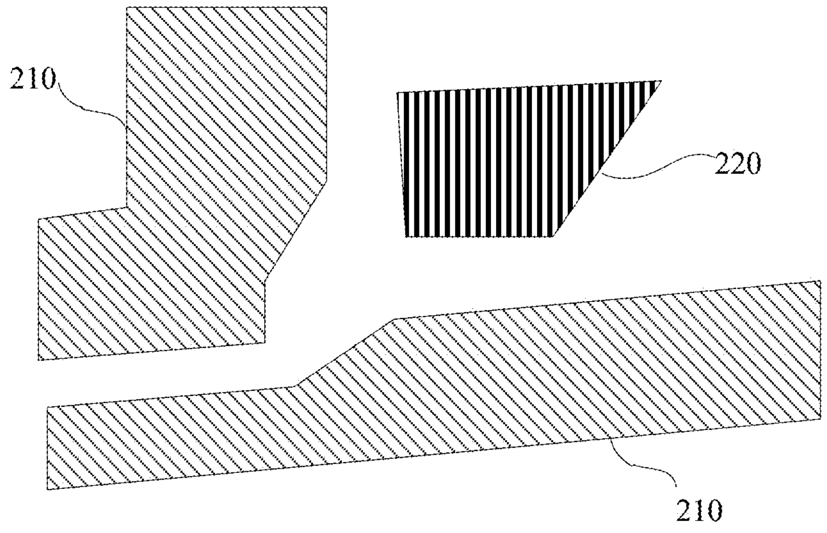

For another example, as shown in FIG. 12, when the shape of the compensation light-shielding portion 220 includes a plate shape and the corner of the light shielding portion 210 is close to a right angle, the shape of the compensation light-shielding portion 220 may also include a rectangle, a trapezoid, or other regular shapes.

In addition, the shape of the compensation light-shielding portion 220 may also include an irregular shape, as long as the side edge of the compensation light-shielding portion 220 close to the first light shielding sub-portion 211 is parallel to the first light shielding sub-portion 211.

Figure 13:
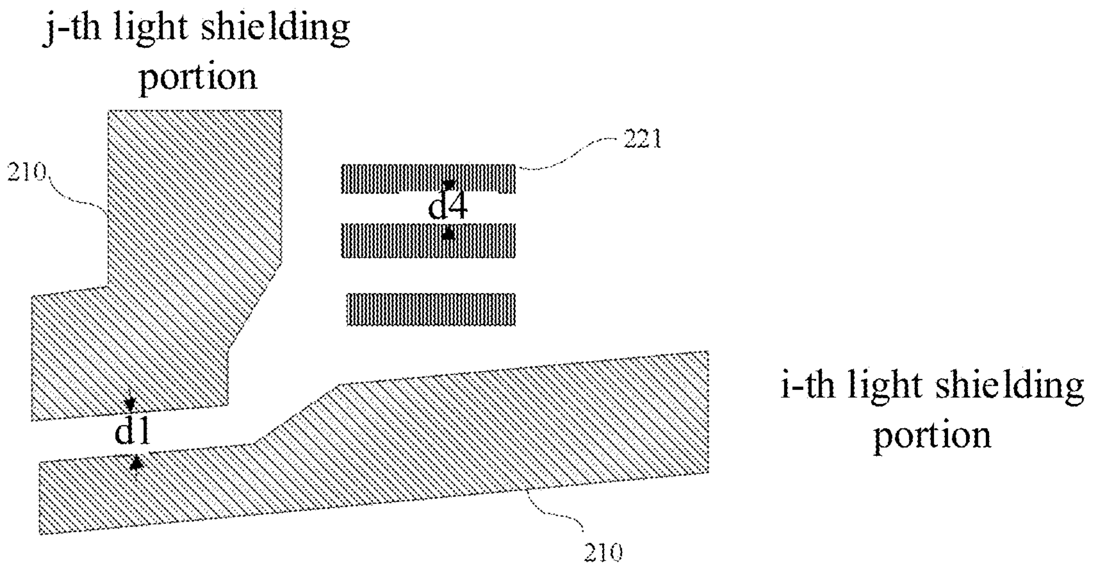

Referring to FIG. 13, in some specific embodiments, the at least one compensation light-shielding portion 220 includes a plurality of compensation light-shielding sub-portions 221 spaced apart. In the at least one compensation light-shielding portion 220, an arrangement direction of a column of compensation light-shielding sub-portions 221 close to the $j^{th}$ light shielding portion 210 is substantially parallel to an extension direction of the first light shielding sub-portion 211 of the $j^{th}$ light shielding portion 210.

Compared to a plate-shaped compensation light-shielding portion 220, the compensation light-shielding portion 220 including a plurality of compensation light-shielding sub-portions 221 spaced apart may allow the isolation portion finally formed on the display substrate to be a plurality of dispersed small blocks, which may help to prevent an accumulation of static electricity on the isolation portion and therefore avoid a circuit damage caused by a static discharge.

For example, the compensation light-shielding portion 220 may include one or more columns of compensation light-shielding sub-portions 221. The more compensation light-shielding sub-portions 221 and the smaller each compensation light-shielding sub-portion 221, the better the effect of improving the accumulation of static electricity.

When the compensation light-shielding portion 220 includes one column of compensation light-shielding sub-portions 221, that column of compensation light-shielding sub-portions 221 may be arranged in the second direction Y. When the compensation light-shielding portion 220 includes a plurality of columns of compensation light-shielding sub-portions 221, a column of compensation light-shielding sub-portions 221 close to the first light shielding sub-portion 211 may be arranged in the second direction Y. In this way, an arrangement direction of the plurality of compensation light-shielding sub-portions 221 close to the first light shielding sub-portion 211 of the at least one compensation light-shielding portion 220 may be arranged parallel to the first light shielding sub-portion 211, so as to maintain a uniform distance between the compensation light-shielding portion 220 and the adjacent first light shielding sub-portion 211, and prevent the interference with the pattern of the signal line lead LY formed based on the first light shielding sub-portion 211 in the patterning process.

Figure 15:
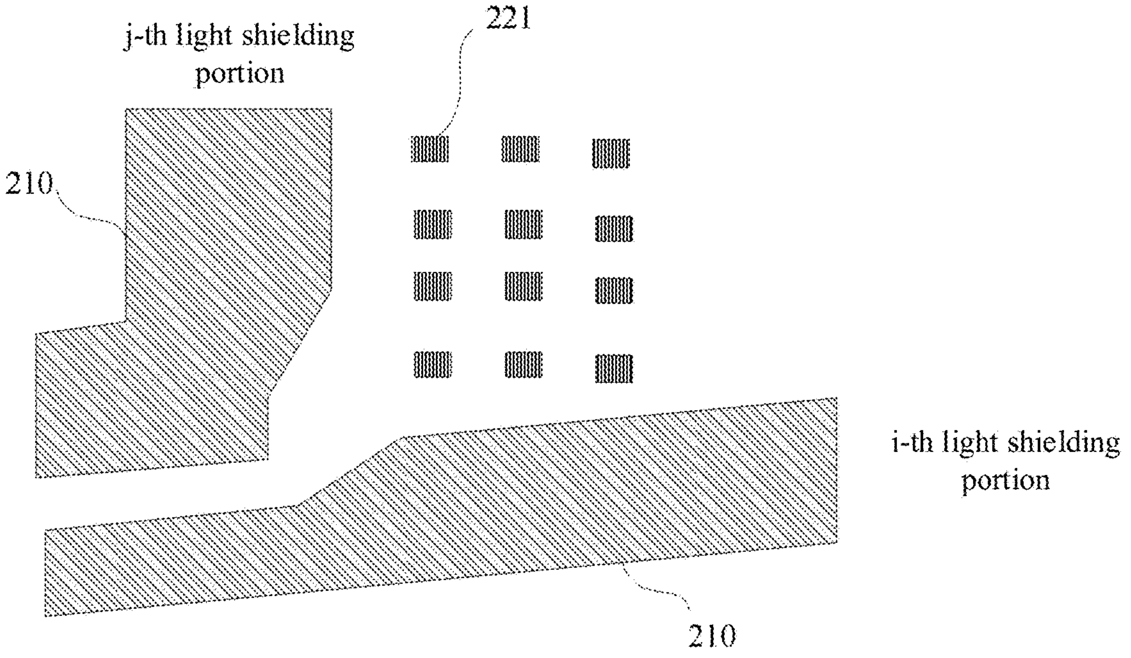

Referring to FIG. 15, in the embodiments of the present disclosure, when the compensation light-shielding portion 220 includes a plurality of columns of compensation light-shielding sub-portions 221, the compensation light-shielding sub-portions 221 in each column may be arranged in the second direction Y. When the compensation light-shielding portion 220 includes one column of compensation light-shielding sub-portions 221, each compensation light-shielding sub-portion 221 in that column may extend in the first direction X. For example, each of the plurality of compensation light-shielding sub-portions 221 in the compensation light-shielding portion 220 may be a horizontal strip extending in the first direction X.

Figure 14:
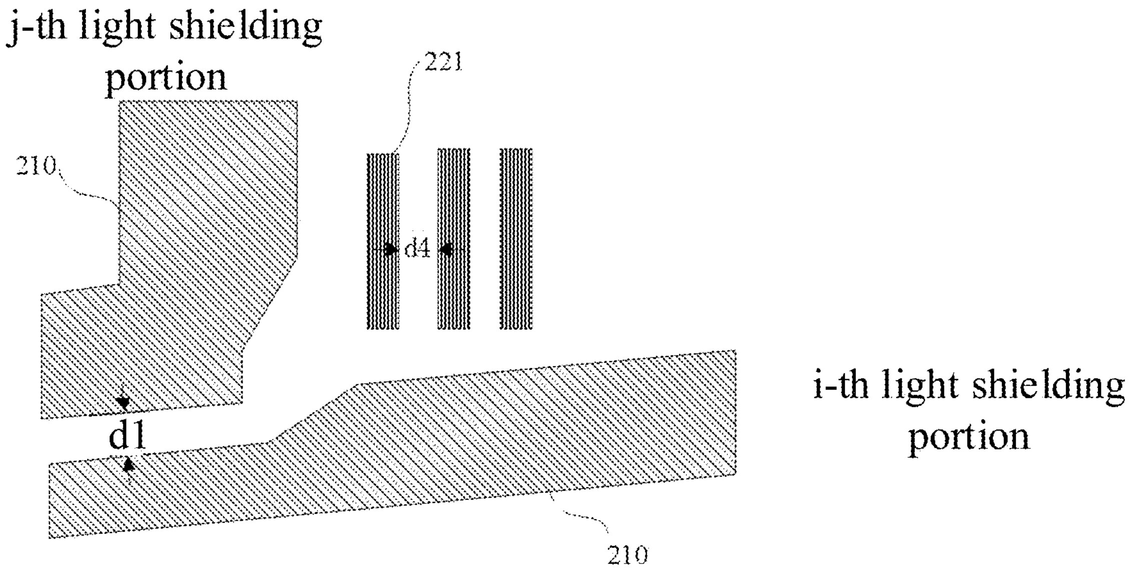

Referring to FIG. 14, in some specific embodiments, the plurality of compensation light-shielding sub-portions 221 in the compensation light-shielding portion 220 may be arranged in the first direction, and the compensation light-shielding sub-portion 221 close to the $j^{th}$ light shielding portion 210 is arranged parallel to the first light shielding sub-portion 211 of the $j^{th}$ light shielding portion 210. For example, each of the plurality of compensation light-shielding sub-portions 221 in the compensation light-shielding portion 220 may be a vertical strip extending in the second direction Y.

Referring to FIG. 15, in some specific embodiments, the plurality of compensation light-shielding sub-portions 221 in the compensation light-shielding portion 220 may be arranged in an array.

In some specific embodiments, the first predetermined distance d1 is formed between the second light shielding sub-portion 214 of the $i^{th}$ light shielding portion 210 and the second light shielding sub-portion 214 of the $j^{th}$ light shielding portion 210. A fourth predetermined distance d4 is formed between at least two compensation light-shielding sub-portions 221 in the at least one compensation light-shielding portion 220. The fourth predetermined distance d4 is greater than or equal to the first predetermined distance d1.

In the embodiments of the present disclosure, the fourth predetermined distance d4 being formed between at least two compensation light-shielding sub-portions 221 in the at least one compensation light-shielding portion 220 may refer to that the fourth predetermined distance d4 is formed between two adjacent compensation light-shielding sub-portions 221. The two adjacent compensation light-shielding sub-portions 221 may refer to two compensation light-shielding sub-portions 221 between which no other compensation light-shielding sub-portions 221 are provided. The fourth predetermined distance d4 may refer to an average distance between the two adjacent compensation light-shielding sub-portions 221.

In the embodiments of the present disclosure, by forming the fourth predetermined distance d4 between two compensation light-shielding sub-portions 221 and setting the fourth predetermined distance d4 to be greater than or equal to the first predetermined distance d1, it is possible to maintain an optimal distance between the plurality of compensation light-shielding sub-portions 221 while effectively reducing the exposure intensity at position E, thereby preventing the accumulation of static electricity.

Optionally, when the plurality of compensation light-shielding sub-portions 221 in the compensation light-shielding portion 220 are arranged in an array, a distance between any two adjacent compensation light-shielding sub-portions 221 may be set as the fourth predetermined distance d4, that is, either the distance between two compensation light-shielding sub-portions 221 adjacent in the first direction X or the distance between two compensation light-shielding sub-portions 221 adjacent in the second direction Y may be set as the fourth predetermined distance d4.

In some specific embodiments, the mask plate includes at least one first sub-region S1 used to form at least one fan-out region S of the display substrate, the plurality of light shielding portions 210 includes at least one first light shielding portion 210*a* and at least one second light shielding portion 210*b*, and the at least one first light shielding portion 210*a* and the at least one second light shielding portion 210*b* are located in the first sub-region S1. For the at least one first sub-region S1, the at least one first light shielding portion 210*a* and the at least one second light shielding portion 210*b* in that first sub-region S1 are symmetrically arranged about a center line ZL of the first sub-region S1. The plurality of compensation light-shielding portions 220 include at least one first compensation light-shielding portion 220*a* and at least one second compensation light-shielding portion 220*b*. An orthographic projection of the at least one first compensation light-shielding portion 220*a* on the first base substrate 200 is located between orthographic projections of two adjacent first light-shielding portions 210*a* on the first base substrate 200. An orthographic projection of the at least one second compensation light-shielding portion 220*b* on the first base substrate 200 is located between orthographic projections of two adjacent second light-shielding portions 210*b* on the first base substrate 200.

In the embodiments of the present disclosure, a plurality of fan-out regions S may be formed on the display substrate. In each fan-out region S, some signal line leads LY may be converged. For example, the signal line leads LY in a left half of the fan-out region S may be bent to the right, and the signal line leads LY in a right half of the fan-out region S may be bend to the left, so that the plurality of signal line leads LY may be converged toward the center line ZL1 of the fan-out region S after being bent.

Correspondingly, the first sub-regions S1 on the mask plate are in one-on-one correspondence to the fan-out regions S on the display substrate. For example, the first light shielding portion 210*a* located in the left half of the first sub-region S1 may be bent to the right through the first corner portion 212, and the second light shielding portion 210*b* located in the right half of the first sub-region S1 may be bent to the left through the first corner portion 212, so that the plurality of light shielding portions 210 may be converged toward the center line ZL of the first sub-region S1 after being bent.

In some specific embodiments, for the at least one first sub-region S1, the at least one first compensation light-shielding portion 220*a* and the at least one second compensation light-shielding portion 220*b* are symmetrically arranged about the center line ZL of the first sub-region S1.

The first compensation light-shielding portion 220*a* is arranged close to the first corner portion 212 of the first light shielding portion 210*a* on the right side of the first compensation light-shielding portion 220*a*, thereby reducing the exposure intensity between the first corner portion 212 of the first light shielding portion 210*a* and the first width gradient portion 213 of the adjacent first light shielding portion 210*a*. The second compensation light-shielding portion 220*b* is arranged close to the first corner portion 212 of the second light shielding portion 210*b* on the left side of the second compensation light-shielding portion 220*b*, thereby reducing the exposure intensity between the first corner portion 212 of the second light shielding portion 210*b* and the first width gradient portion 213 of the adjacent second light shielding portion 210*b*. In this way, regardless of which direction the light shielding portion 210 is bent in, a compensation light-shielding portion 220 is provided close to the bending region, so that the problem of too high exposure intensity close to the width gradient portion of any light shielding portion 210 may be improved.

Optionally, the light shielding portion 210 may be bent once, or the light shielding portion 210 may be bent multiple times.

Figure 16:
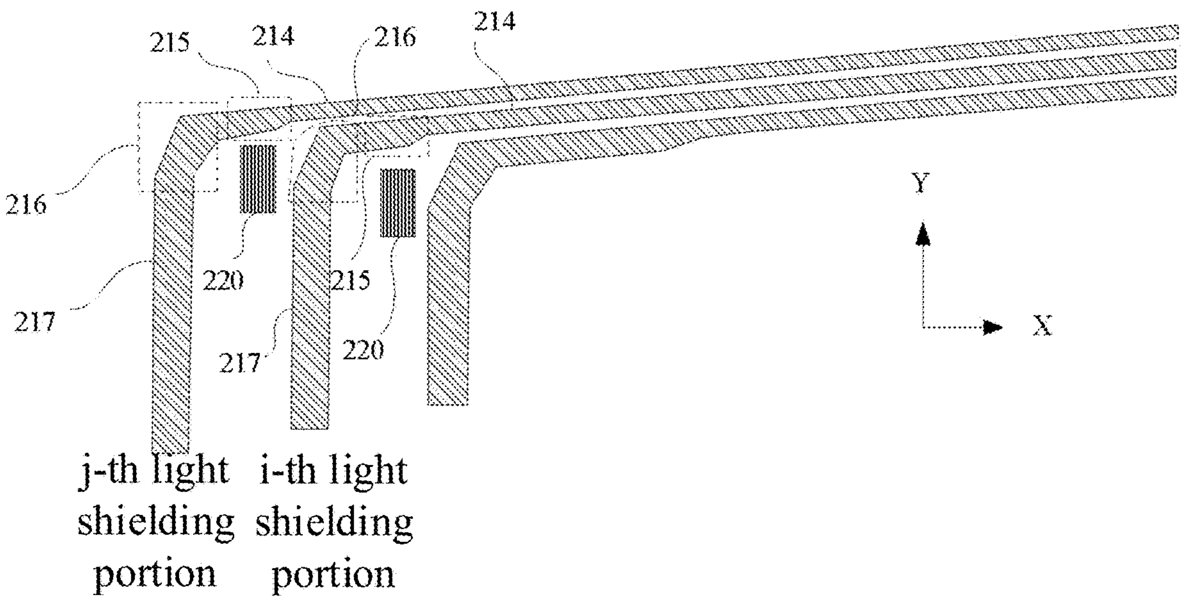
FIG. 16 schematically shows a schematic diagram of a second corner portion according to the embodiments of the present disclosure.

FIG. 16 schematically shows a schematic diagram of a second corner portion according to the embodiments of the present disclosure. Referring to FIG. 16, in some specific embodiments, the at least one light shielding portion 210 further includes a second width gradient portion 215, a second corner portion 216, and a third light shielding sub-portion 217. The second width gradient portion is connected between the second light shielding sub-portion 214 and the second corner portion, and the second corner portion is connected between the second width gradient portion 215 and the third light shielding sub-portion 217. The third light shielding sub-portions 217 of the plurality of light shielding portions 210 are arranged in the first direction X and extend in the second direction Y.

In the embodiments of the present disclosure, the light shielding portion 210 may be bent twice. In this way, the light shielding portions 210 bent twice may finally be converged, and the light shielding portions 210 after a second bending may still extend in the second direction Y. Based on a mask plate having such pattern, it is possible to form signal line leads LY bent twice on the display substrate, so that the signal line leads LY may extend vertically downward after converging, which may help an electrical connection to the pad PAD.

An orthographic projection of the at least one compensation light-shielding portion 220 in the second direction Y overlaps at least partially with an orthographic projection of the second width gradient portion of the $j^{th}$ light shielding portion 210 in the second direction Y. An orthographic projection of the compensation light-shielding portion 220 in the first direction X overlaps at least partially with an orthographic projection of the second corner portion of the $i^{th}$ light shielding portion 210 in the first direction X. A corner of the second corner portion of the $j^{th}$ light shielding portion 210 is oriented toward the $i^{th}$ light shielding portion 210.

In other words, the compensation light-shielding portion 220 further includes a third compensation light-shielding portion provided close to the second corner portion, in addition to the first compensation light-shielding portion 220*a* and the second compensation light-shielding portion 220*b* close to the above-mentioned first corner portion 212. The third compensation light-shielding portion is also used to block light during exposure to reduce the exposure intensity. In this way, each bending position of the light shielding portion 210 is provided with a compensation light-shielding portion 220 to improve the problem of too high exposure intensity, thereby improving the problem of too thin or broken signal line lead LY at each bending position.

In the embodiments of the present disclosure, for a determination of a specific structure of the third compensation light-shielding portion, reference may be made to the first compensation light-shielding portion 220*a* (or the second compensation light-shielding portion 220*b*) mentioned above, which will not be repeated here. For example, a shape of the third compensation light-shielding portion 220 may include a right triangle or a rectangle, etc. For another example, a distance between the third compensation light-shielding portion 220 and the second corner portion of the $i^{th}$ light shielding portion 210, a distance between the third compensation light-shielding portion 220 and the second width gradient portion of the $j^{th}$ light shielding portion 210, etc., will not be listed in detail in the embodiments of the present disclosure.

Figure 17:
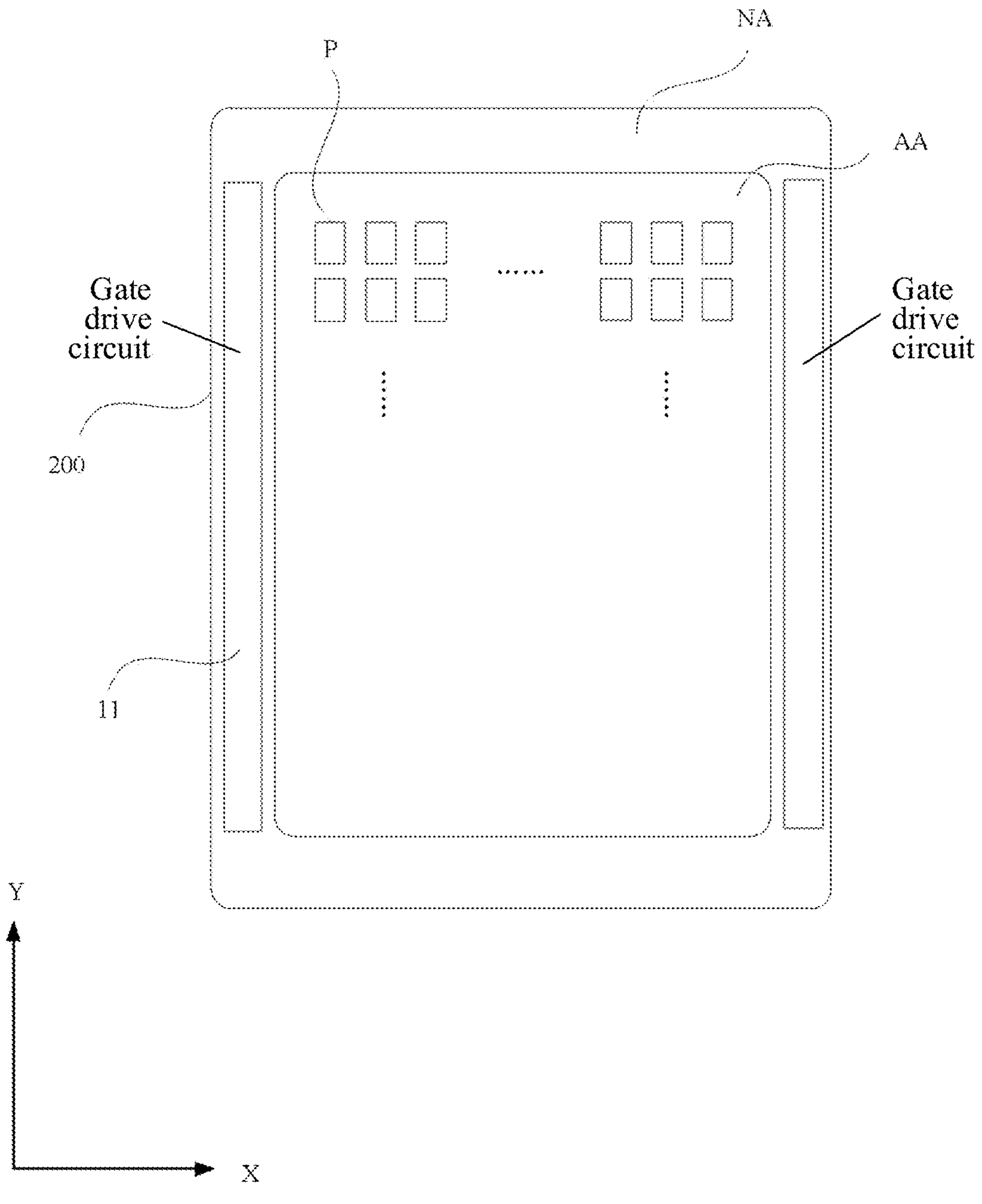
FIG. 17 schematically shows a second schematic diagram of a display substrate according to the embodiments of the present disclosure.

Some embodiments of the present disclosure further provide a display substrate. FIG. 17 schematically shows a second schematic diagram of the display substrate according to the embodiments of the present disclosure. With reference to FIG. 4 and FIG. 17 in combination, the display substrate of the embodiments of the present disclosure includes a display region AA and a peripheral region NA located on at least one side of the display region AA. The display substrate may further include a gate drive circuit 11 and a pad PAD, which are located in the peripheral region NA. The pad PAD is used to electrically connect the signal line lead LY on the display substrate to the driver chip. For example, the gate drive circuit 11 may be located on at least one side of the display region AA. In the embodiments shown in FIG. 17, the gate drive circuit 11s are located on a left side and a right side of the display region AA, respectively. It should be noted that the left side and the right side may refer to a left side and a right side of the display substrate (screen) viewed by human eyes during display. For example, the pad PAD may be located on at least one side of the display region AA. In the embodiments shown in FIG. 17, the pad PAD is located on a lower side of the display region AA. It should be noted that the lower side may be a lower side of the display substrate (screen) viewed by human eyes during display. The driver chip may be folded onto a back side of the display substrate through a chip-on-film or other structures, which helps to achieve a narrow bezel.

The gate drive circuit 11 may be implemented by a shift register, and the gate drive circuit 11 may provide scanning signals to gate lines (not shown) on the display substrate. The driver chip may include a source drive circuit, which may provide data signals to data signal lines (not shown) on the display substrate.

It should be noted that FIG. 17 shows the gate drive circuit 11 is located on the left side and the right side of the display region AA and the pad PAD is located on the lower side of the display region AA. However, the embodiments of the present disclosures are not limited to this, and the gate drive circuit 11 and the driver chip may be located at any suitable position in the peripheral region NA.

For example, the GOA technology, namely Gate Driver on Array, may be adopted for the gate drive circuit 11. In the GOA technology, the gate drive circuit 11 is provided directly on the array substrate to replace an external chip. Each GOA unit serves as a stage of shift register, and each stage of shift register is connected to a gate line. Scanning signals are sequentially output through stages of shift registers to achieve progressive scanning of pixel units. In some embodiments, each stage of shift register may also be connected to a plurality of gate lines. In this way, it may adapt to a development trend of high resolution and narrow bezel of display substrates.

The display substrate further includes a second base substrate 300 and a plurality of pixel units P located on the second base substrate 300 and in the display region AA. Each pixel unit P may include a plurality of sub-pixels. For example, each pixel unit P includes a first sub-pixel SP1, a second sub-pixel SP2, and a third sub-pixel SP3. For the convenience of understanding, the first sub-pixel SP1, the second sub-pixel SP2 and the third sub-pixel SP3 may be described as a red sub-pixel, a green sub-pixel and a blue sub-pixel, respectively. However, the embodiments of the present disclosure are not limited to this. It should be noted that FIG. 4 schematically shows that a shape of the sub-pixel is a rectangle. However, the embodiments of the present disclosures are not limited to this. For example, the shape of the sub-pixel may also be a pentagon, a hexagon, a circle, or other shapes. Moreover, an arrangement manner of the three sub-pixels in a pixel unit is not limited to that shown in FIG. 4.

Figure 18:
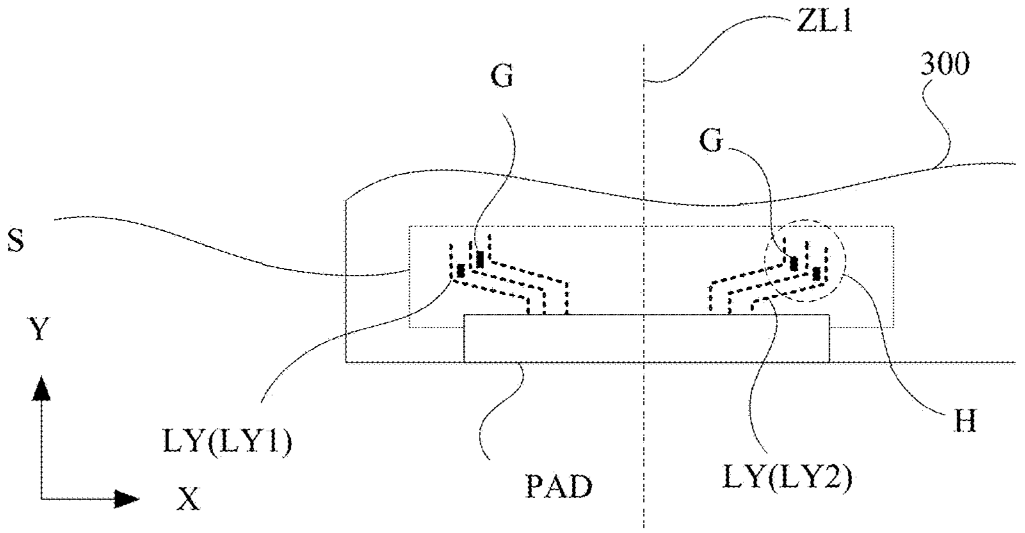
FIG. 18 schematically shows a schematic diagram of a peripheral region according to the embodiments of the present disclosure.

FIG. 18 schematically shows a schematic diagram of a peripheral region according to the embodiments of the present disclosure. With reference to FIG. 4 to FIG. 18 in combination, in the embodiments of the present disclosure, the display substrate further includes a first conductive layer provided on the second base substrate 300, a plurality of signal line leads LY and at least one isolation portion G that are located in the first conductive layer. The at least one isolation portion G is spaced apart from the plurality of signal line leads LY. The plurality of signal line leads LY and the isolation portion G are formed by a patterning process based on the above-mentioned mask plate. As for the specific structure of the mask plate, reference may be made to the aforementioned embodiments, which will not be repeated here.

Figure 19:
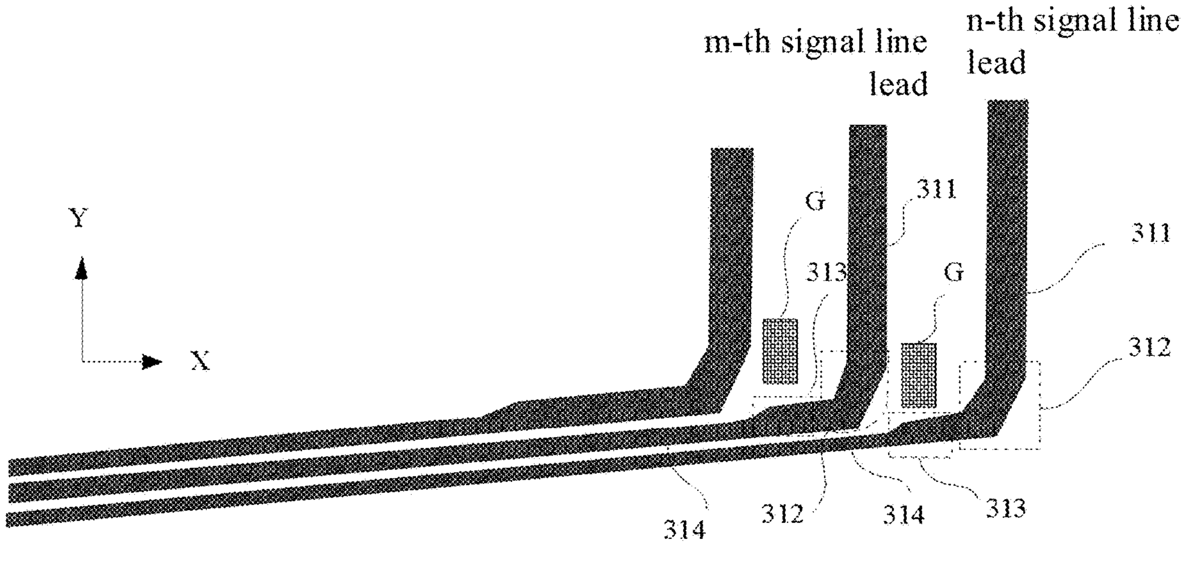
FIG. 19 schematically shows a schematic diagram of position H in FIG. 18.

FIG. 19 schematically shows a schematic diagram of position H in FIG. 18. With reference to FIG. 4 to FIG. 19 in combination, at least one signal line lead LY includes a first lead portion 311, a third width gradient portion 313, a second lead portion 314, and a third corner portion 312. The third corner portion 312 is connected between the first lead portion 311 and the third width gradient portion 313, and the third width gradient portion 313 is connected between the third corner portion 312 and the second lead portion 314. The first lead portions 311 of the plurality of signal line leads LY are arranged in the first direction X, and extend in the second direction Y intersecting with the first direction X. The second lead portions 314 of at least two adjacent signal line leads LY extend substantially in the same direction. An orthographic projection of the at least one isolation portion G on the second base substrate 300 is located between orthographic projections of the two adjacent signal line leads LY on the second base substrate 300. An orthographic projection of the at least one isolation portion G in the second direction Y overlaps at least partially with an orthographic projection of the third width gradient portion 313 of an $n^{th}$ signal line lead LY in the two adjacent signal line leads LY in the second direction Y. An orthographic projection of the isolation portion G in the first direction X overlaps at least partially with an orthographic projection of the third corner portion 312 of an $m^{th}$ signal line lead LY in the two adjacent signal line leads LY in the first direction X. n and m are both positive integers. A corner of the third corner portion 312 of the $n^{th}$ signal line lead LY is oriented toward the $m^{th}$ signal line lead LY. In the at least one signal line lead LY, a line width difference at a connection between the third width gradient portion 313 and the second lead portion 314 is less than or equal to 20%.

In the embodiments of the present disclosure, the signal line lead LY may refer to a data line lead. The data line DL in the display region AA of the display substrate extends in the second direction Y and is electrically connected to the first lead portion 311 of the at least one signal line lead LY in the peripheral region NA, and then electrically connected to the pad PAD through the signal line lead LY.

In the embodiments of the present disclosure, the light shielding portion 210 and the compensation light-shielding portion 220 of the mask plate form a second pattern. In the lithographic process, the light shielding portion 210 and the compensation light-shielding portion 220 may block light during exposure, so that the photoresist located below the light shielding portion 210 and the compensation light-shielding portion 220 may not be subjected to irradiation. In this way, after development, the photoresist subjected to irradiation may be removed, while the photoresist not subjected to irradiation may be retained, so that the retained photoresist may also have the second pattern. Afterwards, a material used to form the signal line lead LY is etched using the photoresist having the second pattern as a mask plate. A portion not covered by the photoresist may be removed after the etching process, and a portion covered by the photoresist may be retained. In this way, an isolation portion and a signal line lead LY having the second pattern may be obtained after etching.

In the embodiments of the present disclosure, the signal line lead LY is bent in a predetermined direction through the third corner portion 312, so that the plurality of signal line leads LY may be converged after being bent.

In the embodiments of the present disclosure, the signal line lead LY is narrowed through the third width gradient portion 313, so that the plurality of signal line leads LY may be arranged in a closer manner after being bent through the third corner portions 312.

In the embodiments of the present disclosure, the plurality of signal line leads LY on the display substrate may include a first signal line lead LY1 and a second signal line lead LY2 symmetrically arranged about the center line ZL1 in the fan-out region S. For example, as shown in FIG. 18, the first signal line lead LY1 is located on the left side of the center line ZL1 in the fan-out region S, and the second signal line lead LY2 is located on the right side of the center line ZL1 in the fan-out region S. For clarity, unless otherwise specified, the second signal line lead LY2 is illustrated by way of example in describing the display substrate of the embodiments of the present disclosure.

In the embodiments of the present disclosure, two adjacent signal line leads LY specifically refer to two signal line leads LY between which no other signal line leads LY of the same type are provided. For example, no other signal line leads LY are provided between two adjacent signal line leads LY.

As mentioned above, at least one compensation light-shielding portion 220 is provided on the mask plate. After a patterning process is performed on the display substrate based on the mask plate, in addition to forming a signal line lead LY on the display substrate, an isolation portion G may be left close to the third corner portion 312 of the signal line lead LY. A pattern of the isolation portion G is substantially the same as the pattern of the compensation light-shielding portion 220 on the mask plate, which will not be repeated in the embodiments of the present disclosure.

In the embodiments of the present disclosure, the third width gradient portion 313 includes a third end and a fourth end, and a width of the third end is greater than that of the fourth end. In at least one signal line lead LY, the third end is connected to the third corner portion 312, and the fourth end is connected to the second lead portion 314. A line width difference at a connection between the third width gradient portion 313 and the second lead portion 314 may refer to a ratio of a difference between a minimum width of the fourth end of the third width gradient portion 313 and a maximum width of the second lead portion 314 to the maximum width of the second lead portion 314. Because the line width difference at the connection between the third width gradient portion 313 and the second lead portion 314 is less than or equal to 20%, the signal line lead LY may still maintain an appropriate width at the narrowed portion, thus avoiding problems such as increased resistance or broken line caused by a too small width. That is to say, the signal line lead 310 in FIG. 19 does not have the depression O as shown in FIG. 2.

In the embodiments of the present disclosure, since at least one compensation light-shielding portion 220 is provided in the mask plate, the compensation light-shielding portion 220 may block light to a certain extent during exposure, so that the exposure intensity at position E may be reduced, then the exposure intensity at position F immediately adjacent to position E may be prevented from being higher than expected, and the problem of missing photoresist caused by this may be avoided. In this way, during the etching process, the material used to form the signal line lead LY at position F may be effectively covered by the photoresist, so that the problem of too thin or even broken signal line lead LY at position F may be avoided, and the product yield may be improved.

Optionally, the signal line lead LY may be bent once, or the signal line lead LY may be bent multiple times.

Figure 20:
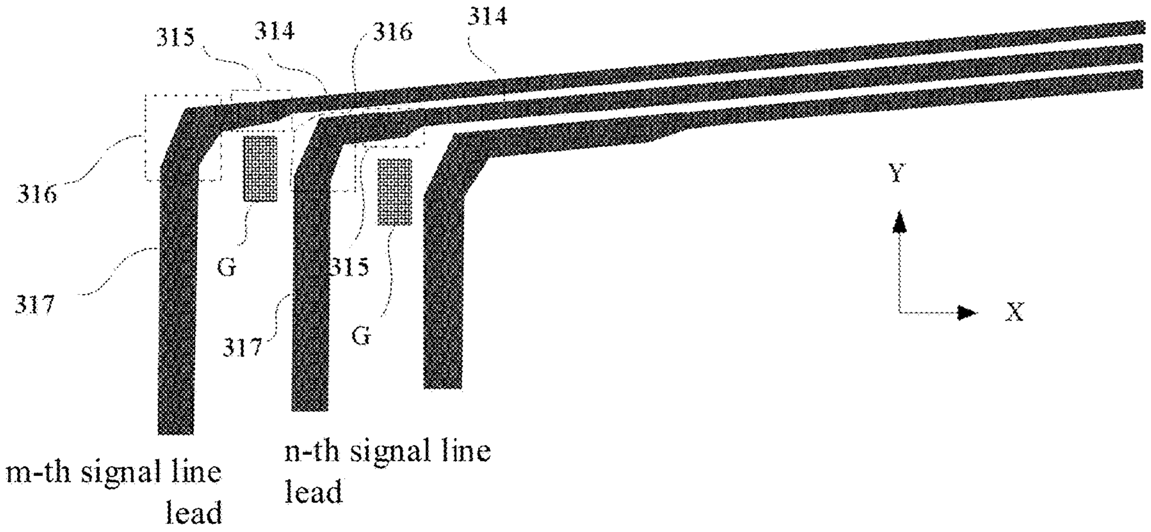
FIG. 20 schematically shows a schematic diagram of a fourth corner portion according to the embodiments of the present disclosure.

FIG. 20 schematically shows a schematic diagram of a fourth corner portion according to the embodiments of the present disclosure. With reference to FIG. 4 to FIG. 20 in combination, for example, in some specific embodiments, at least one signal line lead LY further includes a fourth width gradient portion 315, a fourth corner portion 316, and a third lead portion 317. The fourth width gradient portion 315 is connected between the second lead portion 314 and the fourth corner portion 316, and the fourth corner portion 316 is connected between the fourth width gradient portion 315 and the third lead portion 317. The third lead portions 317 of the plurality of signal line leads LY are arranged in the first direction X and extend in the second direction Y. In the at least one signal line lead LY, a line width difference at a connection between the fourth width gradient portion 315 and the second lead portion 314 is less than or equal to 20%.

In the embodiments of the present disclosure, the signal line lead LY may be bent twice. In this way, the signal line lead LY bent twice may finally be converged, and the signal line lead LY after a second bending may still extend in the second direction Y, which may help an electrical connection to the pad PAD.

As mentioned above, in the mask plate, the compensation light-shielding portion 220 further includes the third compensation light-shielding portion 220 provided close to the second corner portion, in addition to the first compensation light-shielding portion 220*a* and the second compensation light-shielding portion 220*b* provided close to the above-mentioned first corner portion 212. The third compensation light-shielding portion 220 is also used to block some light during exposure to reduce the exposure intensity. Specifically, it is used to block the light close to the fourth width gradient portion 315, so that the photoresist at a second end of the fourth width gradient portion 315 may not be missing. Accordingly, a line width difference at the connection between the fourth width gradient portion 315 and the second lead portion 314 may be less than or equal to 20%, so that the problem of too small line width or broken line at the connection may be avoided.

In this way, at each bending position of the signal line lead LY, a compensation light-shielding portion 220 is correspondingly provided on the mask plate to improve the problem of too high exposure intensity, thereby improving the problem of the signal line lead LY being too thin or broken at each bending position.

It should be noted that the fourth width gradient portion 315 includes a fifth end and a sixth end, and a width of the fifth end is greater than that of the sixth end. In the at least one signal line lead LY, the fifth end is connected to the fourth corner portion 316, and the sixth end is connected to the second lead portion 314. The line width difference at the connection between the fourth width gradient portion 315 and the second lead portion 314 may refer to a ratio of a difference between a minimum width of the sixth end of the fourth width gradient portion 315 and a maximum width of the second lead portion 314 to the maximum width of the second lead portion 314.

Figure 21:
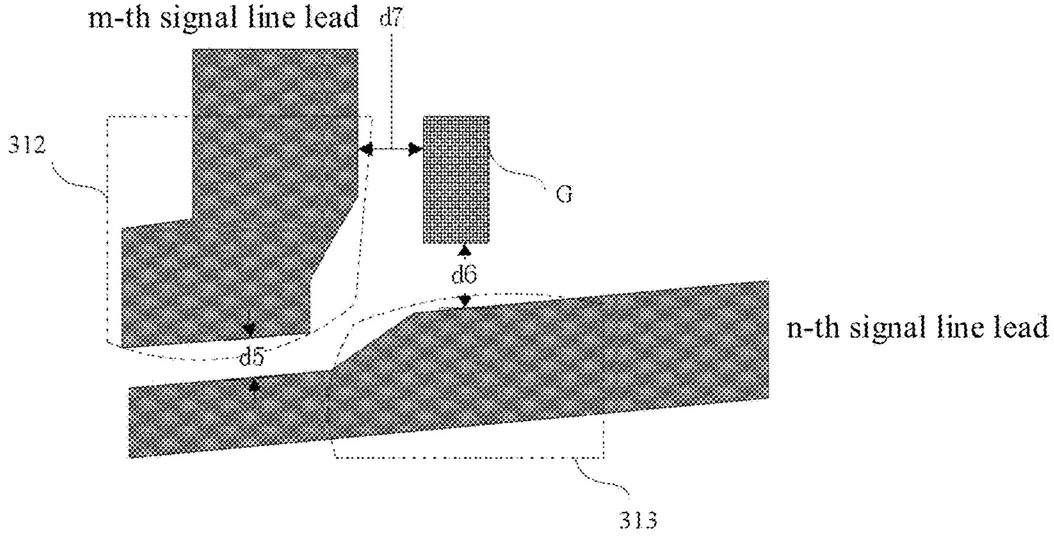
FIG. 21 schematically shows a schematic diagram of a distance between an isolation portion and a signal line lead according to the embodiments of the present disclosure.

FIG. 21 schematically shows a schematic diagram of a distance between the isolation portion and the signal line lead according to the embodiments of the present disclosure. Referring to FIG. 21, in some specific embodiments, a fifth predetermined distance d5 is formed between the second lead portion 314 of the $n^{th}$ signal line lead LY and the second lead portion 314 of the $m^{th}$ signal line lead LY. In the at least one signal line lead LY, the third width gradient portion 313 includes a third end and a fourth end, and a width of the third end is greater than that of the fourth end. The third end is connected to the third corner portion 312, and the fourth end is connected to the second lead portion 314. A sixth predetermined distance d6 is formed between the at least one isolation portion G and the third end of the third width gradient portion 313 of the $n^{th}$ signal line lead LY. A ratio of the sixth predetermined distance d6 to the fifth predetermined distance d5 is greater than or equal to 1.

In some specific embodiments, a seventh predetermined distance d7 is formed between the at least one isolation portion G and the third corner portion 312 of the $m^{th}$ signal line lead LY, and a ratio of the seventh predetermined distance d7 to the fifth predetermined distance d5 is greater than or equal to 1. In this way, an appropriate distance may be maintained between the isolation portion G and the signal line lead LY, which may prevent an interference from the isolation portion G on the signal line lead LY.

Figure 22:
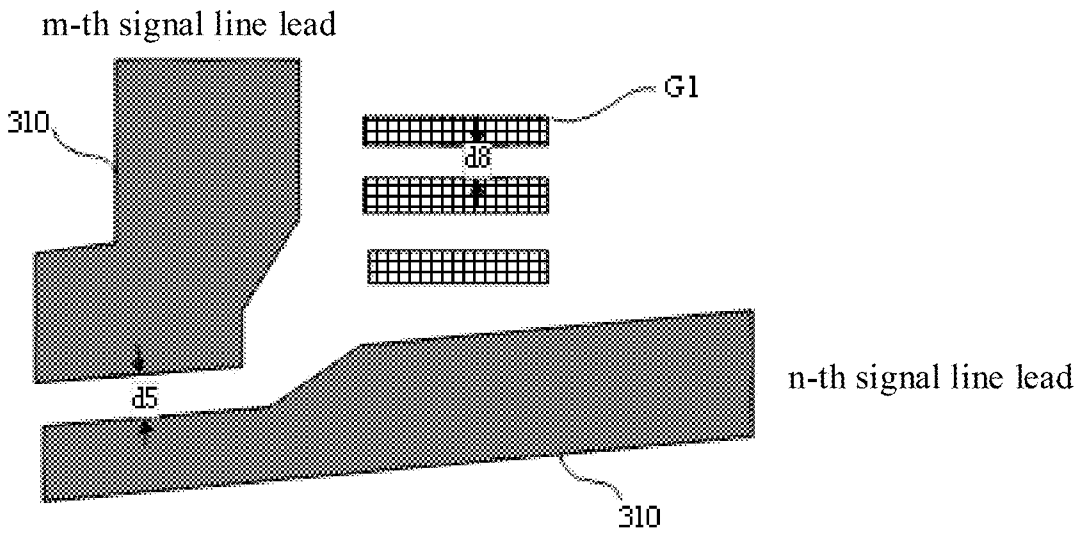
FIG. 22 schematically shows a schematic diagram of a shape of an isolation portion according to the embodiments of the present disclosure.

FIG. 22 schematically shows a schematic diagram of a shape of the isolation portion according to the embodiments of the present disclosure. Referring to FIG. 22, in some specific embodiments, the isolation portion G includes a plurality of metal portions G1 spaced apart. An eighth predetermined distance d8 is formed between at least two metal portions G1, and the eighth predetermined distance d8 is greater than or equal to the fifth predetermined distance d5.

In this way, the isolation portion G may be dispersed into a plurality of small blocks with a large distance, thereby preventing an accumulation of static electricity on the isolation portion G and avoiding a damage to the display substrate due to a static discharge caused by the accumulation of static electricity.

In some specific embodiments, an orthographic projection of the isolation portion G on the second base substrate 300 does not overlap with an orthographic projection of any signal line on the second base substrate 300.

In this way, the isolation portion G may not cause interference with any existing signal line on the display substrate, thereby not increasing a process difficulty or causing other problems.

It should be noted that the pattern of the signal line lead LY in the embodiments of the present disclosure is substantially the same as the pattern of the light shielding portion 210 in the aforementioned embodiments, and the pattern of the isolation portion G is substantially the same as the pattern of the compensation light-shielding portion 220 in the aforementioned embodiments. For details not described in the embodiments of the present disclosure, reference may be made to the aforementioned embodiments, and will not be repeated here. For example, in the embodiments of the present disclosure, the signal line lead LY after being narrowed have a line distance of 2.8 μm and a line width of 2 μm, the distance between the isolation portion G and a wider end of the adjacent third width gradient portion 313 may be less than or equal to 3.3 μm and greater than or equal to 2.8 μm, and the distance between the isolation portion G and the closest third corner portion 312 may be less than or equal to 3.3 μm and greater than or equal to 2.8 μm, and so on.

Figure 23:
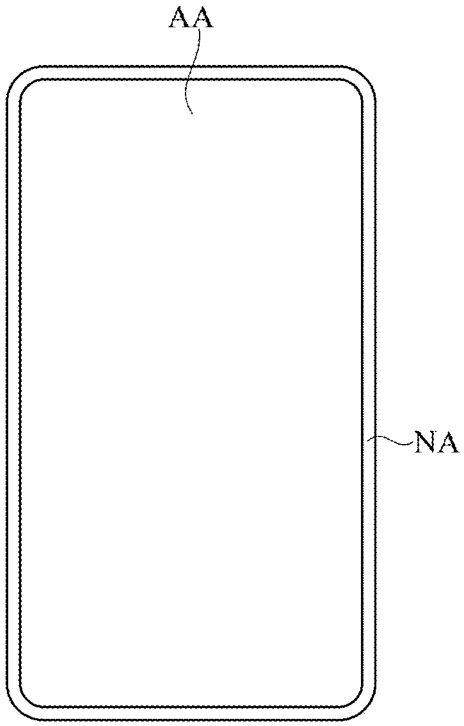
FIG. 23 schematically shows a schematic diagram of a display panel according to the embodiments of the present disclosure.

At least some embodiments of the present disclosure further provide a display panel. FIG. 23 schematically shows a schematic diagram of a display panel according to the embodiments of the present disclosure. Referring to FIG. 23, the display panel includes the display substrate as described above. The display panel has a display region, a peripheral region, and related structures therein. For example, the display panel may be a liquid crystal display panel or an OLED display panel.

It should be understood that the display panel according to the embodiments of the present disclosure has all the features and advantages of the above-mentioned display substrate. The details may be referred to the above descriptions and will not be repeated here.

At least some embodiments of the present disclosure further provide a display device. The display device may include any apparatus or product having a display function. For example, the display device may be a smart phone, a mobile phone, an e-book reader, a desktop personal computer (PC), a laptop PC, a netbook PC, a personal digital assistant (PDA), a portable multimedia player (PMP), a digital audio player, a mobile medical apparatus, a camera, a wearable apparatus (such as a head-mounted apparatus, electronic clothing, electronic bracelet, electronic necklace, electronic accessory, electronic tattoo, or smart watch), a television, etc.

It should be understood that the display device according to the embodiments of the present disclosure has all the features and advantages of the above-mentioned display panel. The details may be referred to the above descriptions and will not be repeated here.

Although some embodiments of the general technical concept of the present disclosure have been illustrated and explained, those ordinary skilled in the art may understand that changes may be made to these embodiments without departing from the principle and spirit of the general technical concept. The scope of the present disclosure is defined by the claims and their equivalents.

What is claimed is:

1. A mask plate, comprising:

a first base substrate;

a light shielding layer provided on the first base substrate; and a plurality of light shielding portions and at least one compensation light-shielding portion provided in the light shielding layer, at least one light shielding portion of the plurality of light shielding portions being configured to form at least one signal line lead in at least one fan-out region of the display substrate, and the at least one compensation light-shielding portion being spaced apart from the plurality of light shielding portions, wherein the plurality of light shielding portions each comprise a first light shielding sub-portion, a first width gradient portion, a second light shielding sub-portion and a first corner portion, the first corner portion is connected between the first light shielding sub-portion and the first width gradient portion, and the first width gradient portion is connected between the first corner portion and the second light shielding sub-portion;

wherein the first light shielding sub-portions of the plurality of light shielding portions are arranged in a first direction, and extend in a second direction intersecting with the first direction; and wherein the second light shielding sub-portions of at least two adjacent light shielding portions extend substantially in the same direction, an orthographic projection of the at least one compensation light-shielding portion on the first base substrate is located between orthographic projections of the two adjacent light shielding portions on the first base substrate, an orthographic projection of the at least one compensation light-shielding portion in the second direction overlaps at least partially with an orthographic projection of the first width gradient portion of an $i^{th}$ light shielding portion in the two adjacent light shielding portions in the second direction, an orthographic projection of the at least one compensation light-shielding portion in the first direction overlaps at least partially with an orthographic projection of the first corner portion of a $j^{th}$ light shielding portion in the two adjacent light shielding portions in the first direction, i and j are positive integers, and a corner of the first corner portion of the $i^{th}$ light shielding portion is oriented toward the $j^{th}$ light shielding portion.

2. The mask plate according to claim 1, wherein the second light shielding sub-portion of the $i^{th}$ light shielding portion is spaced from the second light shielding sub-portion of the $j^{th}$ light shielding portion by a first predetermined distance;

in the plurality of light shielding portions, the first width gradient portion comprises a first end and a second end, a width of the first end is greater than a width of the second end, the first end is connected to the first corner portion, and the second end is connected to the second light shielding sub-portion; and the at least one compensation light-shielding portion is spaced from the first end of the first width gradient portion of the $i^{th}$ light shielding portion by a second predetermined distance, and a ratio of the second predetermined distance to the first predetermined distance is less than or equal to 2:1.

3. The mask plate according to claim 2, wherein the ratio of the second predetermined distance to the first predetermined distance is greater than or equal to 1.

4. The mask plate according to claim 2, wherein the at least one compensation light-shielding portion is spaced from the first corner portion of the $j^{th}$ light shielding portion by a third predetermined distance, and a ratio of the third predetermined distance to the first predetermined distance is less than or equal to 2:1.

5. The mask plate according to claim 4, wherein the ratio of the third predetermined distance to the first predetermined distance is greater than or equal to 1.

6. The mask plate according to claim 4, wherein the second predetermined distance is equal to the third predetermined distance.

7. The mask plate according to claim 2, wherein a ratio of the second predetermined distance to a width of the second light shielding sub-portion of each of the plurality of light shielding pertien is less than or equal to 2:1.

8. The mask plate according to claim 1, wherein a side edge of the at least one compensation light-shielding portion close to the $j^{th}$ light shielding portion extends substantially in the same direction as the first light shielding sub-portion of the $j^{th}$ light shielding portion.

9. The mask plate according to claim 1, wherein the at least one compensation light-shielding portion comprises a plurality of compensation light-shielding sub-portions spaced apart, and in the at least one compensation light-shielding portion, an arrangement direction of a column of compensation light-shielding sub-portions close to the $j^{th}$ light shielding portion is substantially parallel to an extension direction of the first light shielding sub-portion of the $j^{th}$ light shielding portion.

10. The mask plate according to claim 9, wherein the second light shielding sub-portion of the $i^{th}$ light shielding portion is spaced from the second light shielding sub-portion of the $j^{th}$ light shielding portion by a first predetermined distance; and at least two compensation light-shielding sub-portions in the at least one compensation light-shielding portion are spaced by a fourth predetermined distance, and the fourth predetermined distance is greater than or equal to the first predetermined distance.

11. The mask plate according to claim 1, wherein the mask plate comprises at least one first sub-region configured to form the at least one fan-out region of the display substrate, the plurality of light shielding portions comprises at least one first light shielding portion and at least one second light shielding portion, and the at least one first light shielding portion and the at least one second light shielding portion are located in the at least one first sub-region; and wherein:

for each of the at least one first sub-region, the at least one first light shielding portion and the at least one second light shielding portion in the first sub-region are symmetrically arranged about a center line of the first sub-region; and the at least one compensation light-shielding portion comprises at least one first compensation light-shielding portion and at least one second compensation light-shielding portion, an orthographic projection of the at least one first compensation light-shielding portion on the first base substrate is located between orthographic projections of two adjacent first light shielding portions on the first base substrate, and an orthographic projection of the at least one second compensation light-shielding portion on the first base substrate is located between orthographic projections of two adjacent second light shielding portions on the first base substrate.

12. The mask plate according to claim 11, wherein for each of the at least one first sub-region, the at least one first compensation light-shielding portion and the at least one second compensation light-shielding portion are symmetrically arranged about the center line of the first sub-region.

13. The mask plate according to claim 1, wherein each of the plurality of light shielding portions further comprises a second width gradient portion, a second corner portion and a third light shielding sub-portion, the second width gradient portion is connected between the second light shielding sub-portion and the second corner portion, the second corner portion is connected between the second width gradient portion and the third light shielding sub-portion, and the third light shielding sub-portions of the plurality of light shielding portions are arranged in the first direction and extend in the second direction; and an orthographic projection of the at least one compensation light-shielding portion in the second direction overlaps at least partially with an orthographic projection of the second width gradient portion of the $j^{th}$ light shielding portion in the second direction, an orthographic projection of the at least one compensation light-shielding portion in the first direction overlaps at least partially with an orthographic projection of the second corner portion of the $i^{th}$ light shielding portion in the first direction, and a corner of the second corner portion of the $j^{th}$ light shielding portion is oriented toward the $i^{th}$ light shielding portion.

14. A display substrate, comprising a display region and a peripheral region located on at least one side of the display region, wherein the display substrate further comprises:

a base substrate;

a first conductive layer provided on the base substrate; and a plurality of signal line leads and at least one isolation portion provided in the first conductive layer and located in the peripheral region, wherein the at least one isolation portion is spaced apart from the plurality of signal line leads, wherein each of the plurality of signal line leads comprises a first lead portion, a third width gradient portion, a second lead portion and a third corner portion, the third corner portion is connected between the first lead portion and the third width gradient portion, and the third width gradient portion is connected between the third corner portion and the second lead portion;

wherein the first lead portions of the plurality of signal line leads are arranged in a first direction, and extend in a second direction intersecting with the first direction;

wherein the second lead portions of at least two adjacent signal line leads extend substantially in the same direction, an orthographic projection of the at least one isolation portion on the base substrate is located between orthographic projections of the two adjacent signal line leads on the base substrate, an orthographic projection of the at least one isolation portion in the second direction overlaps at least partially with an orthographic projection of the third width gradient portion of an nt signal line lead in the two adjacent signal line leads in the second direction, an orthographic projection of the at least one isolation portion in the first direction overlaps at least partially with an orthographic projection of the third corner portion of an $m^{th}$ signal line lead in the two adjacent signal line leads in the first direction, n and m are positive integers, and a corner of the third corner portion of the $n^{th}$ signal line lead is oriented toward the $m^{th}$signal line lead; and wherein in at least one of the plurality of signal line leads, a line width difference at a connection between the third width gradient portion and the second lead portion is less than or equal to 20%.

15. The display substrate according to claim 14, wherein the second lead portion of the $n^{th}$ signal line lead is spaced from the second lead portion of the mth signal line lead by a fifth predetermined distance;

in the at least one of the plurality of signal line leads, the third width gradient portion comprises a third end and a fourth end, a width of the third end is greater than a width of the fourth end, the third end is connected to the third corner portion, and the fourth end is connected to the second lead portion; and the at least one isolation portion is spaced from the third end of the third width gradient portion of the $n^{th}$ signal line lead by a sixth predetermined distance, and a ratio of the sixth predetermined distance to the fifth predetermined distance is greater than or equal to 1.

16. The display substrate according to claim 15, wherein the at least one isolation portion is spaced from the third corner portion of the $m^{th}$ signal line lead by a seventh predetermined distance, and a ratio of the seventh predetermined distance to the fifth predetermined distance is greater than or equal to 1.

17. The display substrate according to claim 15, wherein the isolation portion comprises a plurality of metal portions spaced apart, at least two metal portions are spaced by an eighth predetermined distance, and the eighth predetermined distance is greater than or equal to the fifth predetermined distance.

18. The display substrate according to claim 15, wherein the at least one signal line lead further comprises a fourth width gradient portion, a fourth corner portion and a third lead portion, the fourth width gradient portion is connected between the second lead portion and the fourth corner portion, the fourth corner portion is connected between the fourth width gradient portion and the third lead portion, and the third lead portions of the plurality of signal line leads are arranged in the first direction and extend in the second direction; and in the at least one of the plurality of signal line leads, a line width difference at a connection between the fourth width gradient portion and the second lead portion is less than or equal to 20%.

19. A display panel, comprising the display substrate of claim 14.

20. A display device, comprising the display panel of claim 19.

* * * * *